(12) United States Patent
Okumura et al.

(10) Patent No.: US 7,232,591 B2
(45) Date of Patent: Jun. 19, 2007

(54) METHOD OF USING AN ADHESIVE FOR TEMPERATURE CONTROL DURING PLASMA PROCESSING

(75) Inventors: Tomohiro Okumura, Kadoma (JP); Toshinari Nitta, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 346 days.

(21) Appl. No.: 10/408,261

(22) Filed: Apr. 8, 2003

(65) Prior Publication Data

US 2003/0215578 A1 Nov. 20, 2003

(30) Foreign Application Priority Data

Apr. 9, 2002 (JP) ............................. 2002-106164

(51) Int. Cl.
- *H05H 1/24* (2006.01)
- *H01L 21/306* (2006.01)
- *C23C 16/00* (2006.01)

(52) U.S. Cl. .................. 427/569; 156/345.51; 118/728

(58) Field of Classification Search ................ 427/569; 118/729; 156/345.52, 345.53

See application file for complete search history.

(56) References Cited

U.S. PATENT DOCUMENTS

| | | | | |
|---|---|---|---|---|
| 5,886,863 A | * | 3/1999 | Nagasaki et al. ........... 361/234 |
| 5,904,779 A | * | 5/1999 | Dhindsa et al. .......... 118/723 E |
| 6,071,630 A | * | 6/2000 | Tomaru et al. ............. 428/627 |
| 6,083,341 A | * | 7/2000 | Wei et al. ................. 156/274.4 |

FOREIGN PATENT DOCUMENTS

| | | | |
|---|---|---|---|
| JP | 63311726 A | * | 12/1988 |
| JP | 2-155230 | | 6/1990 |
| JP | 2758755 | | 10/1998 |
| JP | 3010683 | | 12/1999 |

\* cited by examiner

*Primary Examiner*—Timothy Meeks
*Assistant Examiner*—David Turocy
(74) *Attorney, Agent, or Firm*—Wenderoth, Lind & Ponack, L.L.P.

(57) ABSTRACT

Provided is a plasma processing method and apparatus and a tray for plasma processing, which are able to improve temperature controllability of a substrate. If a vacuum chamber is evacuated by a pump while introducing a specified gas by a gas supply unit into the vacuum chamber and a high-frequency power is applied by a coil use high-frequency power supply to a coil while maintaining an interior of the vacuum chamber at a specified pressure, then plasma is generated in the vacuum chamber, and a substrate placed on a substrate electrode can be subjected to plasma processing. At this time, by providing an adhesive sheet between the substrate electrode and the substrate, temperature controllability of the substrate can be improved.

25 Claims, 25 Drawing Sheets

METHOD OF USING AN ADHESIVE FOR TEMPERATURE CONTROL DURING PLASMA PROCESSING

BACKGROUND OF THE INVENTION

The present invention relates to a plasma processing method and apparatus and a tray for plasma processing to be utilized for manufacturing electronic devices, micro machines (MEMS: Micro Electromechanical Systems), boards for mounting components, and the like.

FIG. 19 shows one example of a generic parallel plate type plasma processing apparatus.

Referring to FIG. 19, if a vacuum chamber 201 is evacuated by a pump 203, as an exhauster, while introducing a specified gas by a gas supply unit 202 into the vacuum chamber 201 and high-frequency power of 13.56 MHz is applied to a substrate electrode 206 by a substrate electrode high-frequency power supply 210 while maintaining an interior of the vacuum chamber 201 at a specified pressure by a pressure-regulating valve 204, then plasma is generated in the vacuum chamber 201, and a substrate 209 placed on the substrate electrode 206 can be subjected to plasma processing of etching, deposition, surface reforming, or the like. Turbo-molecular pump 203 and an exhaust port 211 are disposed just under the substrate electrode 206, and the pressure-regulating valve 204 is an up-and-down valve disposed just under the substrate electrode 206 and just over the turbo-molecular pump 203. The substrate electrode 206 is fixed to the vacuum vessel 201 with four props 212. Moreover, an opposite electrode 241 is provided oppositely to the substrate electrode 206.

As another plasma processing apparatus, there is a plasma processing apparatus of a high-frequency induction system for generating plasma in a vacuum vessel by applying high-frequency power to a coil. The plasma processing apparatus of this system, which generates plasma by generating a high-frequency magnetic field in the vacuum vessel and accelerating electrons by generating an inductive electric field inside the vacuum vessel by its high-frequency magnetic field, is able to generate plasma of a density higher than parallel plate type plasma.

FIG. 20 shows one example of this construction. Referring to FIG. 20, by evacuating a vacuum chamber 201 by a turbo-molecular pump 203, as an exhauster, while introducing a specified gas from a gas supply unit 202 into the vacuum vessel 201 and by applying high-frequency power of 13.56 MHz to a coil provided along a dielectric plate 207, opposite to a substrate electrode 206, by a coil use high-frequency power supply 205 while maintaining an interior of the vacuum vessel 201 at a specified pressure by a pressure-regulating valve 204, inductive-coupling type plasma is generated in the vacuum vessel 201, and a substrate 209 placed on the substrate electrode 206 can be subjected to plasma processing.

There is also provided a substrate-electrode use high-frequency power supply 210 for supplying high-frequency power to the substrate electrode 206, thereby making it possible to control ion energy that reaches the substrate 209. The turbo-molecular pump 203 and the exhaust port 211 are disposed just under the substrate electrode 206, and the pressure-regulating valve 204 is an up-and-down valve disposed just under the substrate electrode 206 and just over the turbo-molecular pump 203. The substrate electrode 206 is fixed to the vacuum vessel 201 with four props 212.

Up to now, various materials have been used as surface material of the substrate electrode. Besides metals such as aluminum and stainless steel, there have been an example in which only a part of a surface of a substrate electrode is covered with an insulating layer (hard alumite), and only the insulating layer is brought into contact with a substrate as disclosed in U.S. Pat. No. 2,758,755, an example in which a substrate electrode portion to be brought into contact with a substrate is covered with a dielectric film (vinyl chloride, Teflon (the registered trademark of U.S. Dupont of Polytetrafluoroethylene resin mold), or polyimide) as disclosed in Japanese Laid-Open Patent Publication No. 2-155230, an example in which a substrate electrode portion to be brought into contact with a substrate is covered with a dielectric film constructed of at least one of vinyl chloride, Teflon, and polyimide, and a self-bias voltage of the substrate electrode is monitored to detect damage of the dielectric film as disclosed in U.S. Pat. No. 3,010,683, and so on. As described above, if a dielectric layer is provided between the substrate and the substrate electrode, there is an effect of reducing charge-up damage.

There is another method for improving thermal conduction of a substrate and a substrate electrode by covering a surface of the substrate electrode with a ceramic layer and applying a DC voltage to a DC electrode buried in the ceramic layer for suction of the substrate onto the substrate electrode surface with an electrostatic force, or for pressing of the substrate against the substrate electrode by a clamp ring. There is also a method for improving thermal conduction of a substrate and a substrate electrode by supplying gas (helium or the like), which becomes a thermal medium, between the substrate and the substrate electrode.

However, the aforementioned conventional system has had an issue in that, if it has been attempted to process a thin soft substrate (resin sheet, for example), a temperature of the substrate has disadvantageously been raised by plasma exposure.

This is attributed to the fact that heat exchange between the substrate and the substrate electrode becomes insufficient in a vacuum in addition to a small thermal capacity of the substrate. If it is attempted to suck the substrate onto the substrate electrode surface with an electrostatic force, then a direct current scarcely flows through a dielectric substrate, and the suction cannot take effect. Moreover, if gas that becomes a thermal medium is supplied between the substrate and the substrate electrode with the substrate pressed against the substrate electrode by a clamp ring, then the substrate is significantly deformed because the substrate is thin and soft. This not only impairs uniformity of processing but also possibly generates abnormal discharge in a space formed between the substrate and the substrate electrode, thereby lacking practicability.

Moreover, if gas that becomes a thermal medium is supplied between the substrate and the substrate electrode when the substrate is large, thin, hard, and easy to break (silicon, glass, ceramics, or the like) in the conventional system, then the substrate significantly deforms because the substrate is thin, and the substrate sometimes breaks. Particularly, when a substrate thickness is not greater than 1 mm and an area is not smaller than 0.1 m$^2$, the aforementioned issue sometimes occurs.

SUMMARY OF THE INVENTION

In view of the aforementioned conventional issues, it is an object of the present invention to provide a plasma processing method and apparatus and a tray for plasma processing, which are able to improve temperature controllability of a substrate.

In order to achieve the aforementioned object, the present invention is constructed as follows.

According to a first aspect of the present invention, there is provided a plasma processing method comprising:

evacuating an interior of a vacuum chamber and supplying gas into the vacuum chamber, and then generating plasma in the vacuum chamber while controlling the interior of the vacuum chamber to be at a specified pressure; and processing a substrate or a film on a substrate placed on a substrate electrode in the vacuum chamber while performing heat exchange between the substrate and the substrate electrode via an adhesive sheet disposed between the substrate electrode and the substrate.

According to a second aspect of the present invention, there is provided a plasma processing method comprising:

evacuating an interior of a vacuum chamber and supplying gas into the vacuum chamber, and then generating plasma in the vacuum chamber while controlling the interior of the vacuum chamber to be at a specified pressure; and processing a substrate or a film on a substrate on a tray placed on a substrate electrode in the vacuum chamber while performing heat exchange between the tray and the substrate via an adhesive sheet disposed between the tray and the substrate.

According to a third aspect of the present invention, there is provided the plasma processing method as defined in the second aspect, wherein the substrate or the film on the substrate is processed while performing heat exchange between the substrate electrode and the tray via an adhesive sheet disposed between the substrate electrode and the tray.

According to a fourth aspect of the present invention, there is provided a plasma processing method comprising:

transporting a substrate into a vacuum chamber;

holding the substrate while deforming the substrate into a convex shape toward a substrate electrode in the vacuum chamber;

bringing a neighborhood of a central portion of the substrate deformed in the convex shape into contact with an adhesive sheet provided on a surface of the substrate electrode;

bringing almost an entire surface of the substrate into contact with the adhesive sheet provided on the surface of the substrate electrode; and processing the substrate or a film on the substrate by evacuating an interior of the vacuum chamber and supplying gas into the vacuum chamber, and then generating plasma in the vacuum chamber while controlling the interior of the vacuum chamber to be at a specified pressure.

According to a fifth aspect of the present invention, there is provided a plasma processing method comprising:

transporting a substrate into a vacuum chamber;

holding the substrate above a convex substrate electrode in the vacuum chamber;

bringing a neighborhood of a central portion of the substrate into contact with an adhesive sheet provided on a surface of the substrate electrode;

bringing almost an entire surface of the substrate into contact with the adhesive sheet provided on the surface of the substrate electrode by pressing an outer edge portion of the substrate against the substrate electrode; and processing the substrate or a film on the substrate by evacuating an interior of the vacuum chamber and supplying gas into the vacuum chamber, and then generating plasma in the vacuum chamber while controlling the interior of the vacuum chamber to be at a specified pressure.

According to a sixth aspect of the present invention, there is provided a plasma processing method comprising:

bringing almost an entire surface of a substrate into contact with an adhesive sheet provided on a surface of a tray;

transporting the tray into a vacuum chamber;

holding the tray above a substrate electrode in the vacuum chamber;

placing the tray on the substrate electrode; and processing the substrate or a film on the substrate by evacuating an interior of the vacuum chamber and supplying gas into the vacuum chamber, and then generating plasma in the vacuum chamber while controlling the interior of the vacuum chamber to be at a specified pressure.

According to a seventh aspect of the present invention, there is provided the plasma processing method as defined in the first aspect, wherein the adhesive sheet has a thermal conductivity of not smaller than 0.1 W/m·K.

According to an eighth aspect of the present invention, there is provided the plasma processing method as defined in the first aspect, wherein the adhesive sheet has Asker C of not greater than 80.

According to a ninth aspect of the present invention, there is provided the plasma processing method as defined in the first aspect, wherein the adhesive sheet has a hardness of 50 to 60.

According to a tenth aspect of the present invention, there is provided the plasma processing method as defined in the first aspect, wherein the adhesive sheet has a thickness of 0.05 to 0.5 mm.

According to an eleventh aspect of the present invention, there is provided the plasma processing method as defined in the first aspect, wherein the substrate is made of glass or ceramics.

According to a twelfth aspect of the present invention, there is provided the plasma processing method as defined in the first aspect, wherein the substrate is a resin sheet.

According to a thirteenth aspect of the present invention, there is provided the plasma processing method as defined in the first aspect, wherein the substrate has a thickness of 0.001 to 1 mm.

According to a fourteenth aspect of the present invention, there is provided the plasma processing method as defined in the first aspect, wherein the substrate has a thickness of 0.001 to 0.5 mm.

According to a fifteenth aspect of the present invention, there is provided the plasma processing method as defined in the first aspect, wherein, assuming that the substrate has a Young's modulus E (Pa), the substrate has a Poisson's ratio $v$, the substrate has a characteristic length a (m) and the substrate has a thickness h (m), then there holds an expression: $600\times(1-v^2)a^4/(256\times Eh^3) > 0.005$ (m).

According to a sixteenth aspect of the present invention, there is provided a plasma processing apparatus comprising:

a vacuum chamber;

a gas supply unit for supplying gas into the vacuum chamber;

an exhausting unit for exhausting an interior of the vacuum chamber;

a pressure-regulating valve for controlling the interior of the vacuum chamber to be at a specified pressure;

a substrate electrode for placing thereon a substrate in the vacuum chamber;

a high-frequency power supply capable of supplying a high-frequency power to the substrate electrode or a plasma source; and an adhesive sheet, which is disposed on a surface of the substrate electrode and on which the substrate is placed.

According to a seventeenth aspect of the present invention, there is provided a plasma processing apparatus comprising:

a substrate mounting station for placing a substrate on a tray having a surface provided with an adhesive sheet;

a vacuum chamber;

a gas supply unit for supplying gas into the vacuum chamber;

an exhausting unit for exhausting an interior of the vacuum chamber;

a pressure-regulating valve for controlling the interior of the vacuum chamber to be at a specified pressure;

a substrate electrode for placing thereon the tray in the vacuum chamber; and a high-frequency power supply capable of supplying a high-frequency power to the substrate electrode or a plasma source.

According to an eighteenth aspect of the present invention, there is provided the plasma processing apparatus as defined in the sixteenth aspect, wherein the adhesive sheet has a thermal conductivity of not smaller than 0.1 W/m·K.

According to a nineteenth aspect of the present invention, there is provided the plasma processing apparatus as defined in the sixteenth aspect, wherein the adhesive sheet has Asker C of not greater than 80.

According to a twentieth aspect of the present invention, there is provided the plasma processing apparatus as defined in the sixteenth aspect, wherein the adhesive sheet has a hardness of 50 to 60.

According to a twenty-first aspect of the present invention, there is provided the plasma processing apparatus as defined in the sixteenth aspect, wherein the adhesive sheet has a thickness of 0.05 to 0.5 mm.

According to a twenty-second aspect of the present invention, there is provided a tray for plasma processing used for plasma processing for processing a substrate or a film on the substrate, comprising:

an adhesive sheet disposed on a surface on which the substrate is placed.

According to a twenty-third aspect of the present invention, there is provided the tray for plasma processing as defined in the twenty-second aspect, comprising:

another adhesive sheet disposed on a surface opposite from the surface on which the substrate is placed.

According to a twenty-fourth aspect of the present invention, there is provided the tray for plasma processing as defined in the twenty-second aspect, wherein the adhesive sheet has a thermal conductivity of not smaller than 0.1 W/m·K.

According to a twenty-fifth aspect of the present invention, there is provided the tray for plasma processing as defined in the twenty-second aspect, wherein the adhesive sheet has Asker C of not greater than 80.

According to a twenty-sixth aspect of the present invention, there is provided the tray for plasma processing as defined in the twenty-second aspect, wherein the adhesive sheet has a hardness of 50 to 60.

According to a twenty-seventh aspect of the present invention, there is provided the tray for plasma processing as defined in the twenty-second aspect, wherein the adhesive sheet has a thickness of 0.05 to 0.5 mm.

BRIEF DESCRIPTION OF THE DRAWINGS

These and other aspects and features of the present invention will become clear from the following description taken in conjunction with preferred embodiments thereof with reference to accompanying drawings, in which.

DETAILED DESCRIPTION OF THE PREFERRED EMBODIMENTS

Figure 1:
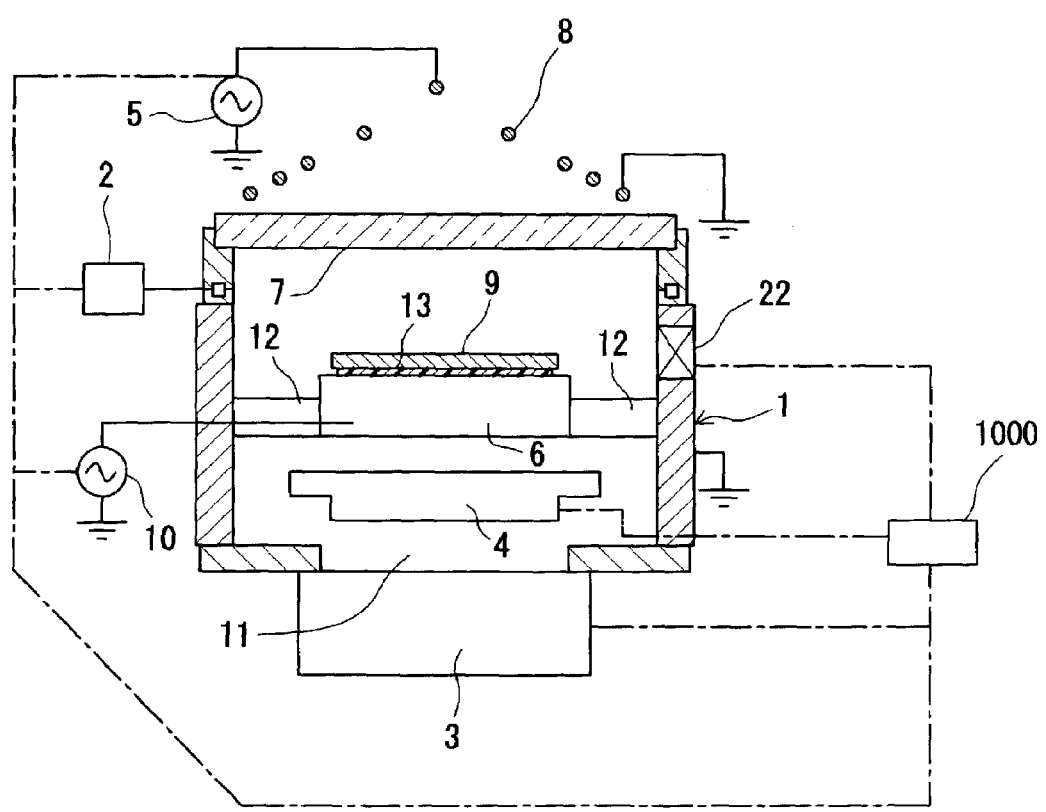
FIG. 1 is a sectional view showing a construction of a plasma processing apparatus used by a plasma processing method according to a first embodiment of the present invention.

Before description of the present invention proceeds, it is to be noted that like parts are designated by like reference numerals throughout the accompanying drawings.

Embodiments of the present invention will be described in detail below on the basis of the drawings.

First Embodiment

A first embodiment of the present invention will be described below with reference to FIGS. 1 through 4C.

FIG. 1 shows a sectional view of a plasma processing apparatus used in the first embodiment of the present invention.

Referring to FIG. 1, by evacuating a vacuum vessel 1, as one example of a vacuum chamber, by a turbo-molecular pump 3, as an exhauster, while introducing a specified gas from a gas supply unit 2 into the vacuum vessel 1 and by applying high-frequency power of 13.56 MHz to a coil 8 (one example of a plasma source) provided along a dielectric plate 7 opposite to a substrate electrode 6, by a coil use high-frequency power supply 5 while maintaining an interior of the vacuum vessel 1 at a specified pressure by a pressure-regulating valve 4, an inductive-coupling type plasma is generated in the vacuum vessel 1, and a substrate 9 placed on the substrate electrode 6 can be subjected to plasma processing.

In this specification and the claims, the substrate 9 can be a thin soft substrate and can be, for example, an object such that a circuit(s) is formed on a resin sheet (for example, sheet of polyimide), paper, or the like.

There is also provided a substrate-electrode use high-frequency power supply 10 for supplying high-frequency power to the substrate electrode 6, thereby making it possible to control ion energy that reaches the substrate 9. The turbo-molecular pump 3 and an exhaust port 11 are disposed just under the substrate electrode 6, and the pressure-regulating valve 4 is an up-and-down valve disposed just under the substrate electrode 6 and just over the turbo-molecular pump 3. The substrate electrode 6 is fixed to the vacuum vessel 1 with four props 12. Operations of the gas supply unit 2, the coil use high-frequency power supply 5, the substrate-electrode use high-frequency power supply 10, the turbo-molecular pump 3, and the pressure-regulating valve 4 are controlled by a control unit 1000. It is to be noted that the control unit 1000 is similar in other embodiments. Therefore, it is representatively shown only in FIG. 1 and is principally omitted in figures of the other embodiments.

An adhesive sheet 13 is provided between the substrate electrode 6 and the substrate 9, thereby making it possible to perform processing while effecting heat exchange between the substrate 9 and the substrate electrode 6 via the adhesive sheet 13.

As one example of the adhesive sheet 13, a silicone rubber film is employed. The adhesive sheet 13 has self-adhesion (self-tack property) in its sheet material itself. The adhesive sheet 13 is preferably to be able to be prevented from deteriorating due to plasma during plasma processing by having a size slightly smaller than that of the substrate 9 or, for example, at least about 1 mm or more smaller than an outer periphery of the substrate. This adhesive sheet 13 has a thermal conductivity of 0.2 W/m·K, Asker C of 60, hardness of 55, and a thickness of 0.2 mm.

It is to be noted that Asker C (ASKER C) is an index of softness of resin, and the fact that Asker C is 60 means that a value measured by an Asker C hardness meter is 60. The greater this value, the harder the material, conversely to a penetration and consistency test.

Asker C means a spring type Asker C type of the standard 0101 of The Society of Rubber Industry, Japan standards (SRIS), and the following measurement method is provided by K6301 (1995)(physical testing method of vulcanized rubber) of Japanese Industrial Standards (JIS).

Spring Type Hardness Test (Type A and Type C)

In principle, a specimen having a thickness of not smaller than 12 mm is used according to type A, and specimens each having a thickness smaller than 12 mm are stacked to secure a thickness of not smaller than 12 mm as much as possible. According to type C, a specimen having a thickness of not smaller than 6 mm is used, and specimens each having a thickness smaller than 6 mm are stacked to secure a thickness of not smaller than 6 mm as much as possible.

Moreover, a surface to be measured of the specimen is polished to become smooth when the surface is not smooth. The surface to be measured is required to have a size such that a pressing surface of a tester is required to have a size that falls at least within the surface to be measured.

Figure 29A:
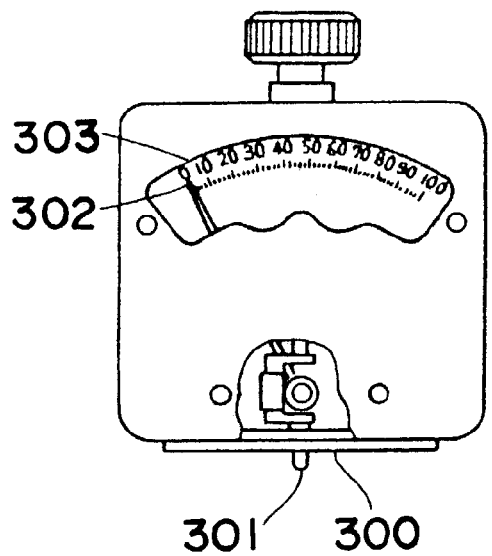
FIGS. 29A, 29B, 29C, and 29D are a front view of a spring type hardness tester of type A or type C, a rear view of the tester with a rear lid thereof removed, an enlarged view of an indentor tip thereof, and a partial sectional view of the tester showing a relationship between the indentor thereof and a pressing surface thereof, for explaining Asker C, respectively.
Figure 29B:
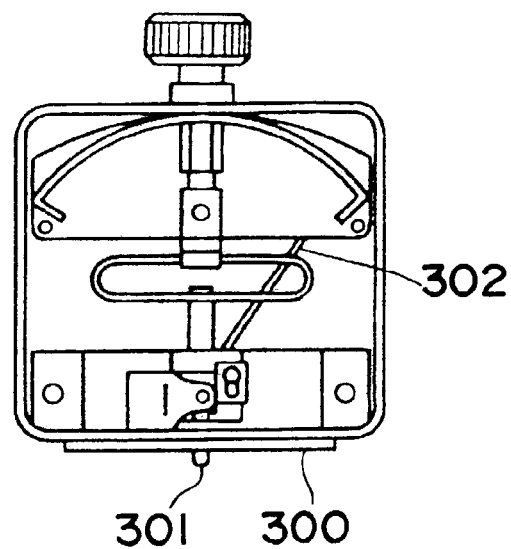
Figure 29C:
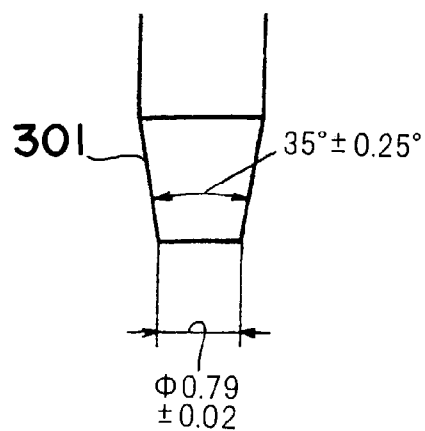
Figure 29D:
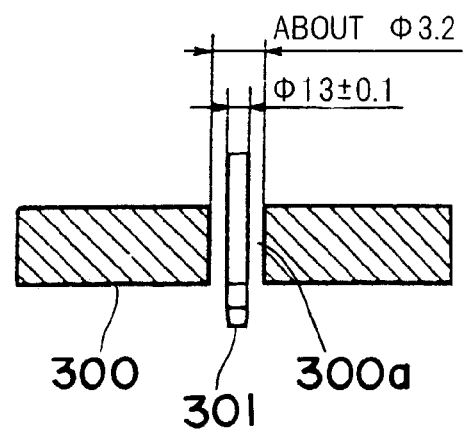
Figure 30A:
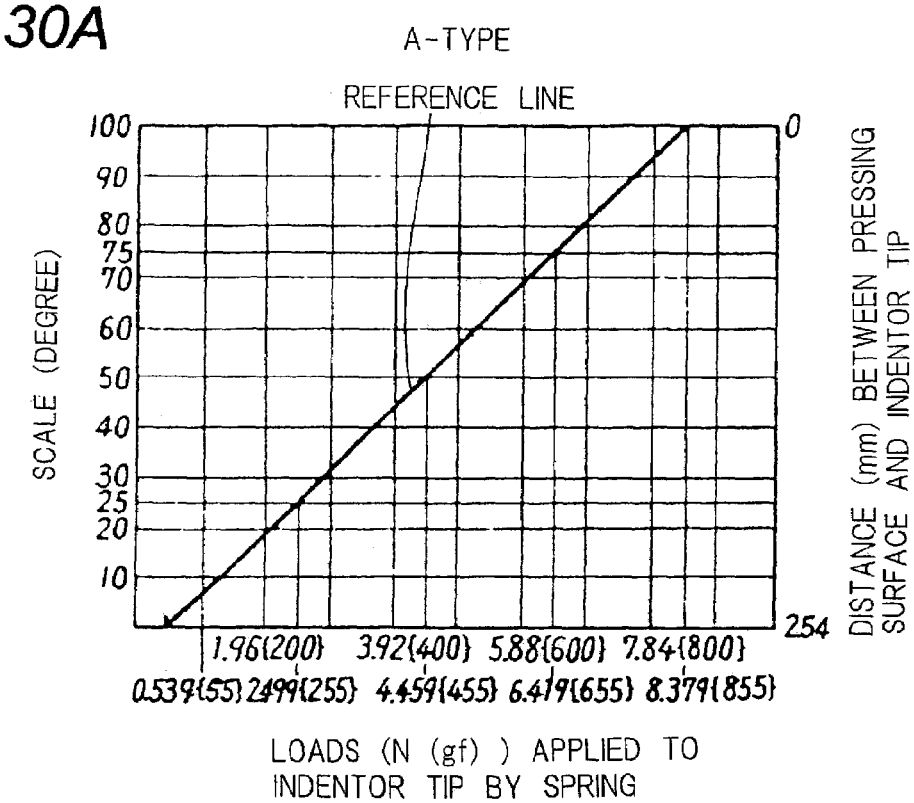
FIGS. 30A and 30B are graphs each showing a distance between the pressing surface and the indentor tip, a load applied to the indentor tip by a spring, and a scale, in order to show reference lines indicating a relationship among the scale, movement of the indentor, and a spring force thereof.
Figure 30B:
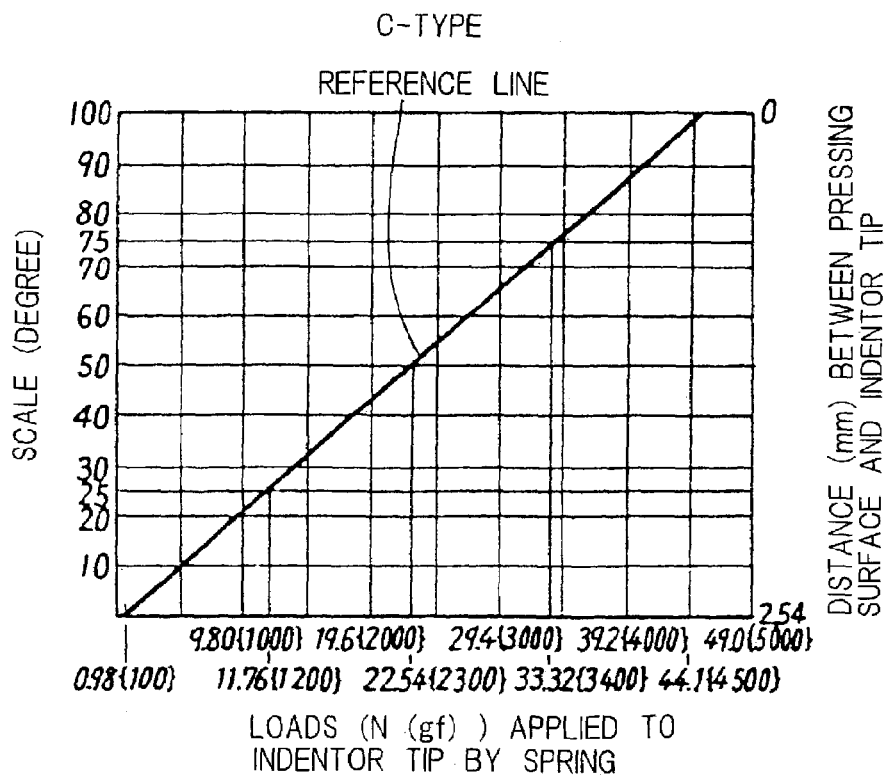

With regard to the tester, a spring type hardness tester of type A or type C shown as one example in FIGS. 29A and 29B is used. This tester indicates, as hardness on a scale 303, a travel distance of an indentor 301 (see FIG. 29C), which is protruded from a hole 300a located at a center of pressing surface 300 by a spring pressure and is pushed back by the rubber surface of the specimen when the pressing surface 300 is brought into contact with the surface of the specimen. The pressing surface 300 is a surface perpendicular to the indentor 301 and has the hole 300a through which the indentor 301 is put at its center as shown in FIG. 29D. A diameter of hole 300a must not be smaller than 10 mm. A tolerance of a reference line (see FIGS. 30A and 30B), which shows relationships between the scale 303, movement of the indentor 301, and a spring force, is assumed to be ±0.0785N{±8gf} in the case of type A and ±0.196N{±20gf} in the case of type C. Moreover, no play is accepted between movement of the indentor 301 and movement of the indicator 302. Material of the indentor 301 is wear-resistant and rust-resistant, and its configuration and dimensions are as shown in FIGS. 29C and 29D. The indentor 301 must be correctly attached to the center of the hole 300a of the pressing surface 300. An indentor tip must protrude from the pressing surface 300 by $2.54^{0}_{-0.05}$ mm at 0 on the scale 303. The indentor tip surface must be located on the same plane as the pressing surface 300 at 100 on the scale 303. The scale 303 is graduated at equal intervals from 0 to 100.

Figure 21:
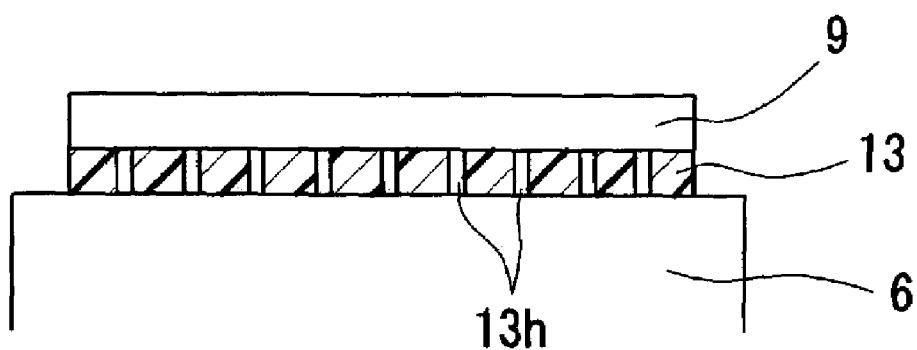
FIG. 21 is a partially sectional explanatory view of a case where an adhesive sheet has through holes in a modification example of an embodiment of the present invention.
Figure 22:
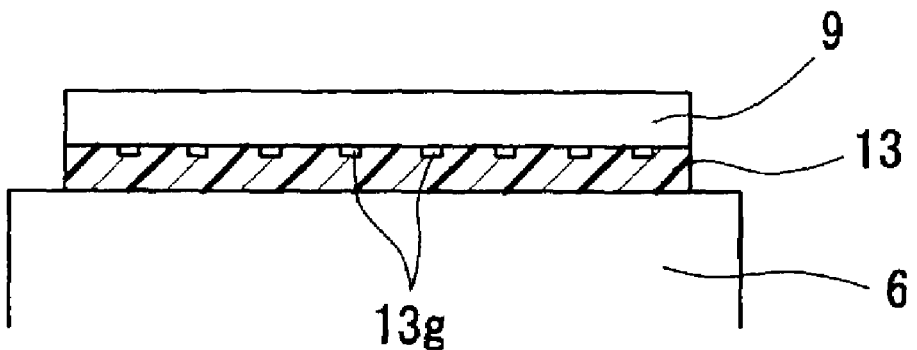
FIG. 22 is a partially sectional explanatory view of a case where an adhesive sheet has grooves in a modification example of an embodiment of the present invention.
Figure 23A:
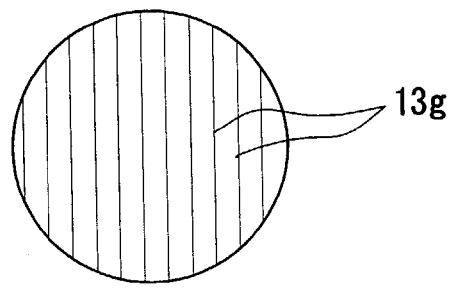
FIGS. 23A, 23B, 23C and 23D are explanatory views of adhesive sheets of various modification examples of an embodiment of the present invention.
Figure 23B:
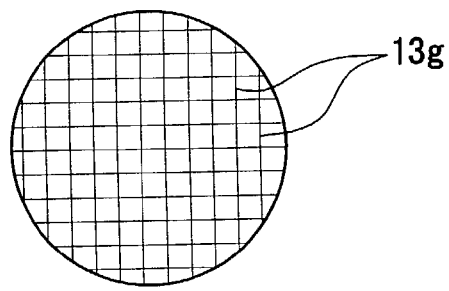
Figure 23C:
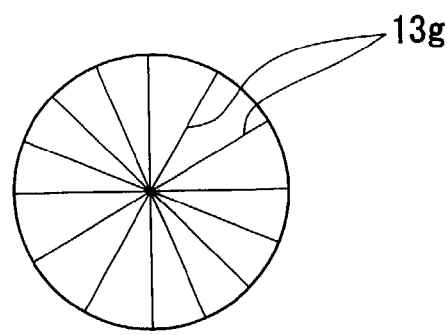
Figure 23D:
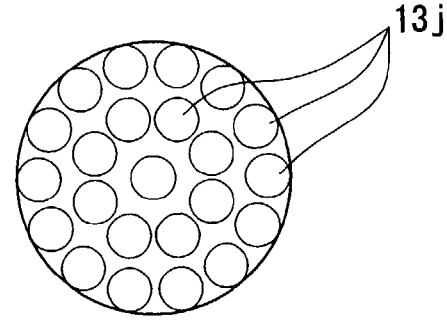

Moreover, in order to effectively prevent occurrence of a gap or foams between the adhesive sheet 13 and the substrate 9, mutually communicating through holes 13h or grooves 13g for allowing foams to easily escape may be formed in the adhesive sheet 13 as shown in FIG. 21 or FIG. 22. Moreover, regarding a manner of arranging the grooves 13g, the grooves may be linearly arranged mutually parallel as shown in FIG. 23A, arranged in a grating-like form as shown in FIG. 23B, arranged radially as shown in FIG. 23C, or arranged between projecting portions 13j as shown in FIG. 23D.

Figure 2A:
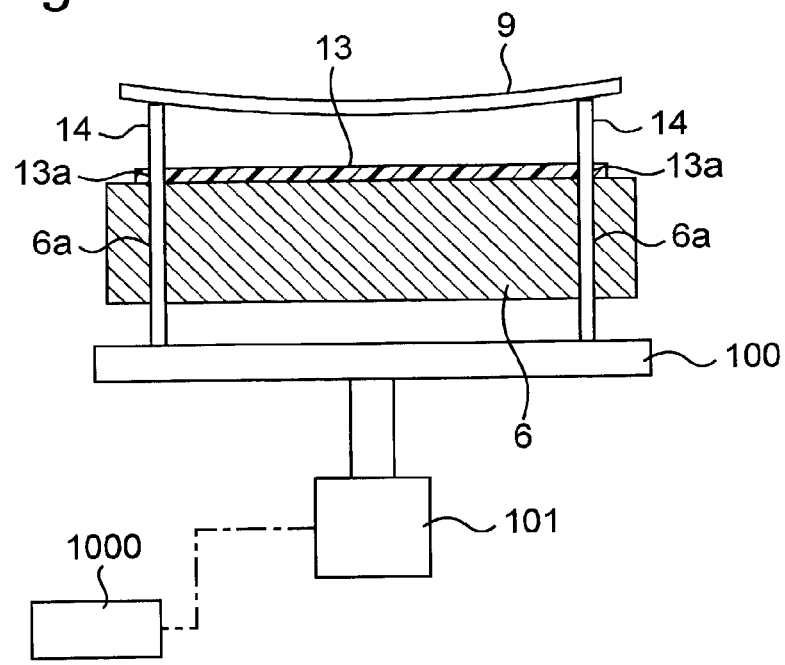
FIGS. 2A, 2B and 2C are sectional views showing processes for placing a substrate on a substrate electrode according to the plasma processing method of the first embodiment of the present invention.
Figure 2B:
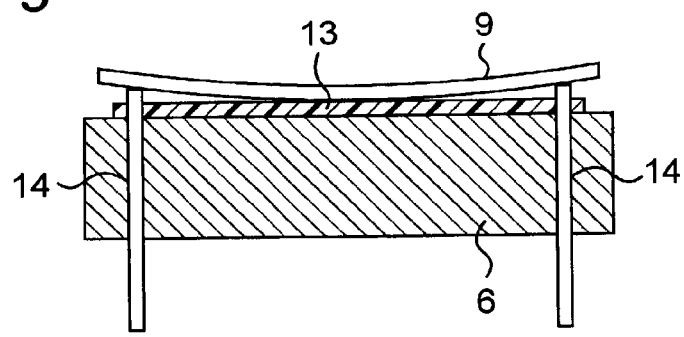
Figure 2C:
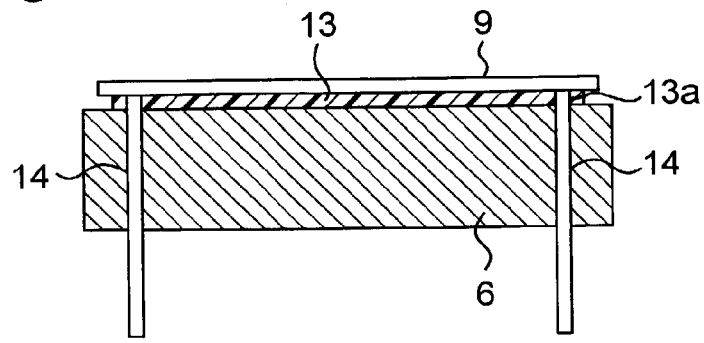

FIGS. 2A through 2C show processes for placing a polyimide resin substrate 9, which has on its surface a 300-nm thick silicon oxide film patterned by a photoresist, and has a thickness h=0.4 mm=0.0004 m, on the substrate electrode 6. It is to be noted that the substrate has a Young's modulus E of 3 GPa, a Poisson's ratio ν of 0.3, a circular substrate configuration, and a diameter a of 0.15 m.

Figure 2D:
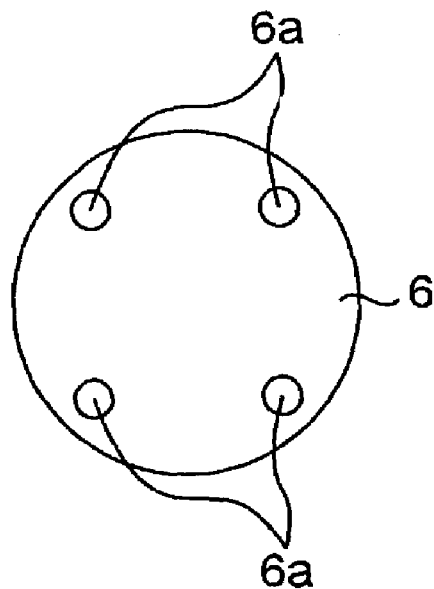
FIGS. 2D and 2E are plan views of different modification examples of the substrate electrode according to the plasma processing method of the first embodiment of the present invention.
Figure 2E:
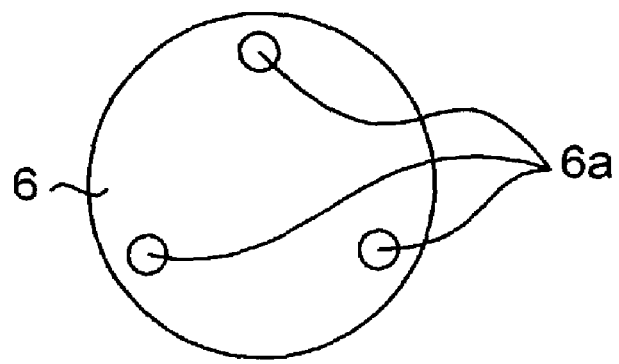

First of all, the substrate 9 is transported from an opening-and-closing gate 22 of the vacuum vessel 1 into the vacuum vessel 1 by use of a transportation arm 23, and thereafter, the substrate 9 is held by a plurality of lift pins 14 (one example of a support member) (FIG. 2A). At this time, the plurality of lift pins 14 that move up and down inside through holes 6a provided in the substrate electrode 6 is provided in the vicinity of an outer peripheral portion of the substrate electrode 6, and therefore, the substrate 9 is deformed into a convex shape protruding toward the substrate electrode 6. The plurality of lift pins 14 (for example, four pins as shown in FIG. 2D or three pins as shown in FIG. 2E) are arranged in point symmetry with respect to a center of the substrate 9. Lower ends of the plurality of lift pins 14 are fixed to a drive ring 100, and the drive ring 100 is driven to move up and down by an air cylinder 101 or the like as one example of a drive unit under control of the control unit 1000. Without being limited to providing a drive unit such as the air cylinder 101 to vertically drive each of the lift pins 14 for enabling each of the lift pins to move up and down, or a drive unit such as the air cylinder 101 to vertically drive a specified number of lift pins 14 for enabling each of the lift pins to move up and down, one by one or together, the substrate may be simply made removable from the substrate electrode 6 or the adhesive sheet 13.

Next, the drive ring 100 is moved down by driving the air cylinder 101 under control of the control unit 1000 to simultaneously gradually move down the plurality of lift pins 14, thereby first bringing a neighborhood of the center of the substrate 9 into contact with the adhesive sheet 13 provided on the surface of the substrate electrode 6 (FIG. 2B).

By further moving down the lift pins 14, the peripheral portion of the substrate 9 is also brought into contact with the adhesive sheet 13, thereby allowing almost an entire surface of the substrate 9 to be brought into contact with the adhesive sheet 13 provided on the surface of the substrate electrode 6 (FIG. 2C).

By using the above-mentioned transportation procedure, it is feasible to prevent occurrence of a gap, in which gas remains, between the substrate 9 and the adhesive sheet 13.

The substrate 9 was placed on the substrate electrode 6, and thereafter, a silicon oxide film on the substrate 9 was subjected to an etching process on condition that the vacuum vessel 1 is supplied with $CF_4$ gas at a rate of 5 sccm and Ar gas at a rate of 45 sccm, with a temperature of the substrate electrode 6 maintained at 30° C., and high-frequency power was applied by 500 W to the coil 8 and 200 W to the substrate electrode 6 with an internal pressure of the vacuum vessel 1 maintained at 3 Pa. Consequently, etching was able to be performed at an etching rate of 100 nm/min. A processing time was 200 seconds including an over-etching time. As a result, burning of the photoresist did not occur, and a satisfactory etching process was able to be performed. When a temperature of the substrate 9 was measured on same conditions, the temperature of the substrate 9 immediately before an end of the etching was 57° C. For the sake of comparison, an etching process was performed on similar conditions by the conventional system (construction having no adhesive sheet). Consequently, burning of the photoresist occurred, and etching failed. Moreover, when a temperature of the substrate 9 was measured on same conditions, the temperature of the substrate 9 immediately before an end of the etching was 195° C.

As described above, a reason why the temperature of the substrate 9 was significantly lowered in comparison with the prior-art example was that processing was able to be performed while effecting heat exchange between the substrate 9 and the substrate electrode 6 via the adhesive sheet 13.

When detaching the substrate 9 from the adhesive sheet 13 after the processing, reversely to the aforementioned transportation procedure, there is a procedure for first moving up the drive ring 100 by the air cylinder 101 under control of the control unit 1000 to simultaneously gradually move up the plurality of lift pins 14, thereby detaching the substrate 9 from the adhesive sheet 13 in a peeling-off manner, and thereafter transporting the substrate 9 to the transportation arm 23 to unload the substrate 9 from inside the vacuum vessel 1.

At this time, if the substrate 9 is supported aslant with respect to the surface of the adhesive sheet 13 by use of long lift pins 14 and short lift pins 14 instead of simultaneously detaching the substrate 9 from the adhesive sheet 13 by, for example, making the plurality of lift pins 14 have different lengths, then the substrate 9 may be more smoothly detached from the surface of the adhesive sheet 13 by first detaching some portions along the periphery of the substrate 9 from the surface of the adhesive sheet 13 by use of the long lift pins 14 and thereafter detaching remaining portions, along the periphery of the substrate 9, from the surface of the adhesive sheet 13 by means of the short lift pins 14, instead of simultaneously detaching an entire peripheral portion of the substrate 9 from the surface of the adhesive sheet 13. In order to perform the above operation, the lift pins 14 may be moved up separately as described hereinabove.

Figure 3A:
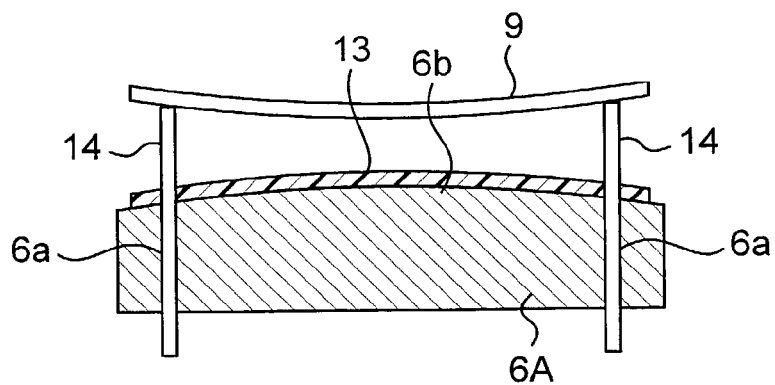
FIGS. 3A, 3B and 3C are sectional views showing processes for placing a substrate on a substrate electrode according to the plasma processing method of the first embodiment of the present invention.
Figure 3B:
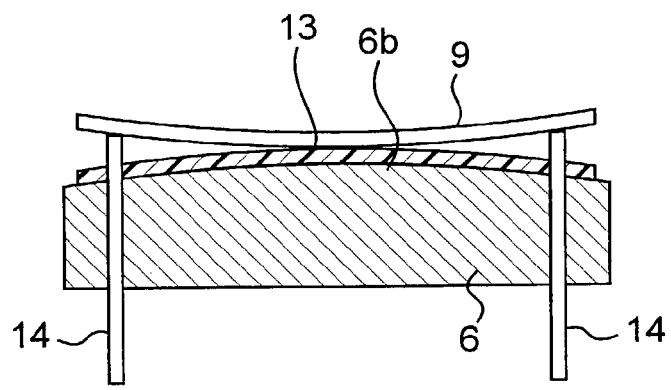
Figure 3C:
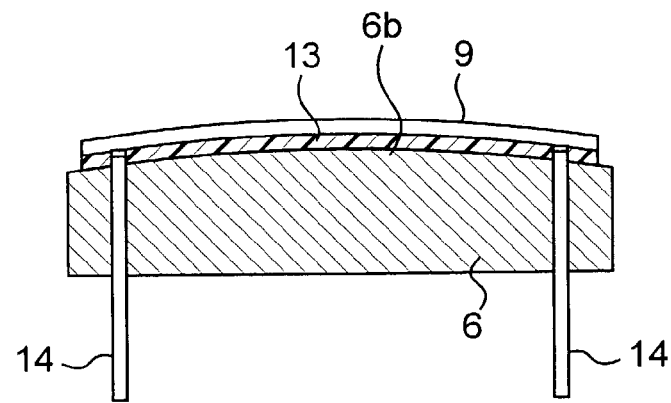

FIGS. 3A through 3C show another example of processes for placing the substrate 9 on the substrate electrode 6. First of all, the substrate 9 is transported into the vacuum vessel 1, and thereafter, the substrate 9 is held (FIG. 3A). At this time, the lift pins 14, which move up and down in through holes 6a provided in a substrate electrode 6A having a convex portion 6b that protrudes while being curved upward so that a center portion becomes a top, are provided in the vicinity of an outer peripheral portion of the substrate electrode 6A. Therefore, the substrate 9 is deformed into a convex shape protruding toward the substrate electrode 6A.

Next, the lift pins 14 are gradually moved down to bring a neighborhood of a center of the substrate 9 into contact with adhesive sheet 13 provided on a surface of the convex portion 6b of the convex substrate electrode 6A that has the surface of the convex portion 6b, of which a central portion in a lateral direction is curved and protruded (FIG. 3B). Further, by moving down the lift pins 14, almost an entire surface of the substrate 9 can be brought into contact with the adhesive sheet 13 provided on the surface of the convex portion 6b of the substrate electrode 6A (FIG. 3C). In this example, the convex substrate electrode 6A having a curvature of, for example, $1/100$ to $1/10$ is employed. Therefore, when handling a substrate 9 that is less prone to deformation, the substrate 9 can reliably be brought into contact with the adhesive sheet 13 initiatively from the neighborhood of the center of substrate 9, and a possibility of occurrence of a gap between the substrate 9 and the adhesive sheet 13 can be reduced. This gap reducing effect is little when the curvature is smaller than $1/100$, while a circuit pattern formed on the substrate 9 tends to easily suffer damage when the curvature exceeds $1/10$. Therefore, the aforementioned range is preferable.

Figure 4A:
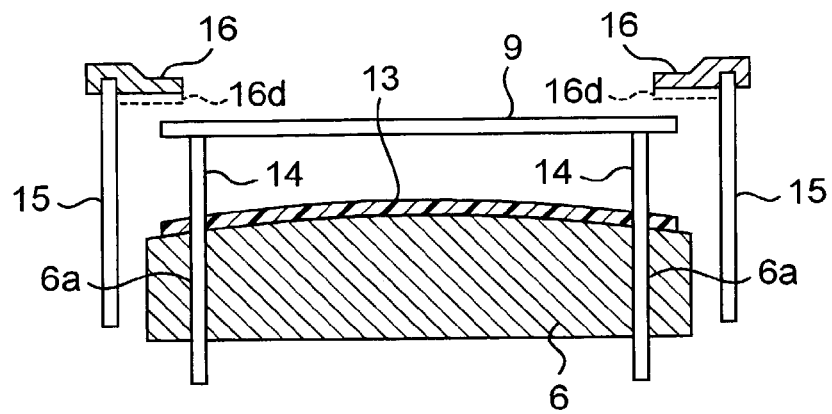
FIGS. 4A, 4B and 4C are sectional views showing processes for placing a substrate on a substrate electrode according to the plasma processing method of the first embodiment of the present invention.
Figure 4B:
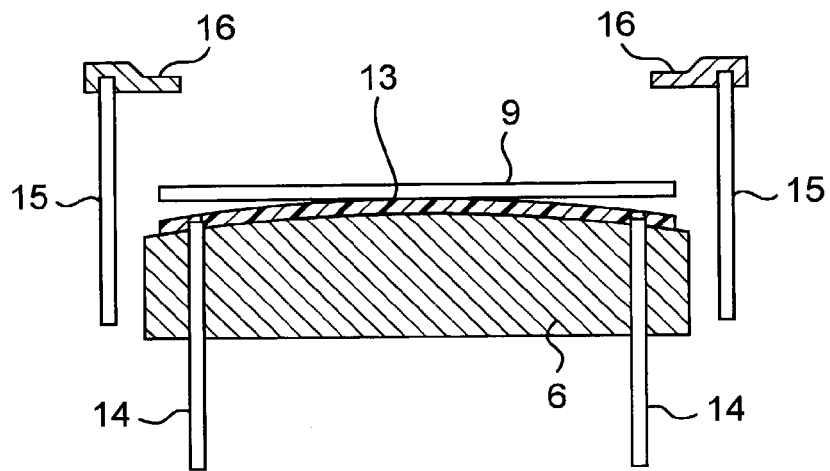
Figure 4C:
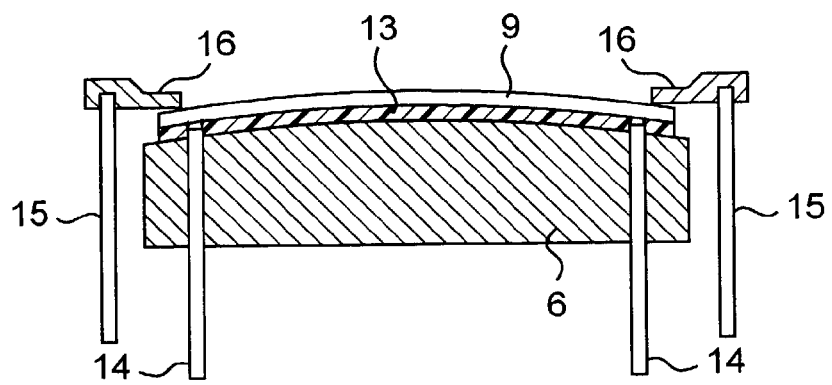

FIGS. 4A through 4C show yet another example of processes for placing the substrate 9 on the substrate electrode 6. First of all, the substrate 9 is transported into the vacuum vessel 1, and thereafter, the substrate 9 is held (FIG. 4A). In this example, the substrate 9 is made of a material that is less prone to deformation, and therefore, a degree of deformation of the substrate 9 protruding toward the substrate electrode 6 is remarkably less than in the case of FIGS. 2A through 2C and FIGS. 3A through 3C.

Next, the lift pins 14 are moved down to bring a neighborhood of a center of the substrate 9 into contact with adhesive sheet 13 provided on a surface of convex substrate electrode 6 (FIG. 4B).

Next, by moving down a clamp ring 16 by use of ring elevation rods 15 to press an outer peripheral portion of the substrate 9 against the substrate electrode 6, almost an entire surface of the substrate 9 can be brought into contact with the adhesive sheet 13 provided on the surface of the substrate electrode 6 (FIG. 4C). In this example, convex substrate electrode 6 is employed. Therefore, even in handling a substrate 9 that is less prone to deformation, the substrate 9 can reliably be brought into contact with the adhesive sheet 13 initiatively from the neighborhood of the center of the substrate 9, and a possibility of occurrence of a gap between the substrate 9 and the adhesive sheet 13 can be reduced.

A lower surface of the clamp ring 16 brought into contact with the substrate 9 may be partially provided with adhesive members 16d as pressing assistance members as indicated by dotted lines in FIG. 4A. With this arrangement, by generating adhesive forces between the clamp ring 16 and the substrate 9, the substrate 9 is more reliably pressed against the substrate electrode 6 without displacement when the substrate 9 is pressed against the substrate electrode 6 by the clamp ring 16, and by lifting the substrate 9 a little by the adhesive forces of the adhesive members 16d when the clamp ring 16 is moved up, the substrate 9 may be easily detached from the substrate electrode 6. Also, by providing the clamp ring 16 partially or entirely with a corrugated member that has no adhesive force and has a mere corrugation as another pressing assistance member at portions, indicated by the dotted lines in FIG. 4A, of the clamp ring 16 and generating a frictional force between the ring 16 and the substrate 9 when the substrate 9 is pressed against the substrate electrode 6 by the clamp ring 16, the substrate 9 can be more reliably pressed against the substrate electrode 6 without displacement.

Figure 24A:
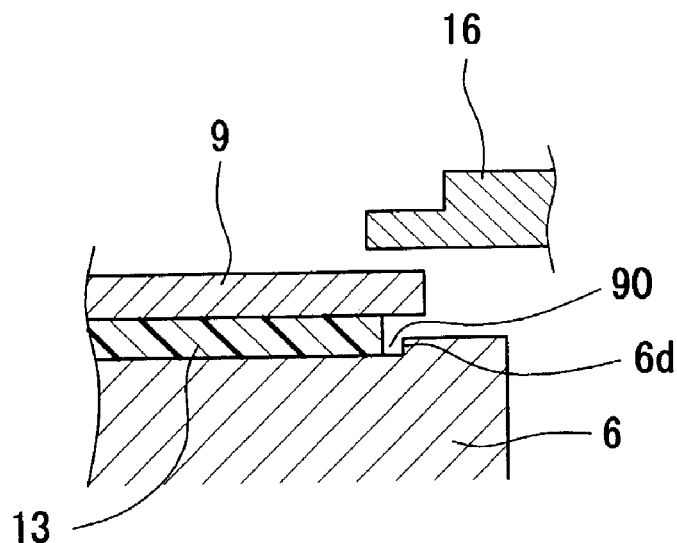
FIGS. 24A, 24B and 24C are an explanatory view for explaining a state in which an adhesive sheet is disposed with interposition of a gap on a recess portion of a substrate electrode in an embodiment of the present invention, an explanatory view for explaining a state in which the adhesive sheet enters the gap as a consequence of pressing of the adhesive sheet together with the substrate by a clamp ring, and an explanatory view for explaining a state in which an adhesive sheet is disposed without interposition of a gap on the recess portion of a substrate electrode, respectively, in an embodiment of the present invention.
Figure 24B:
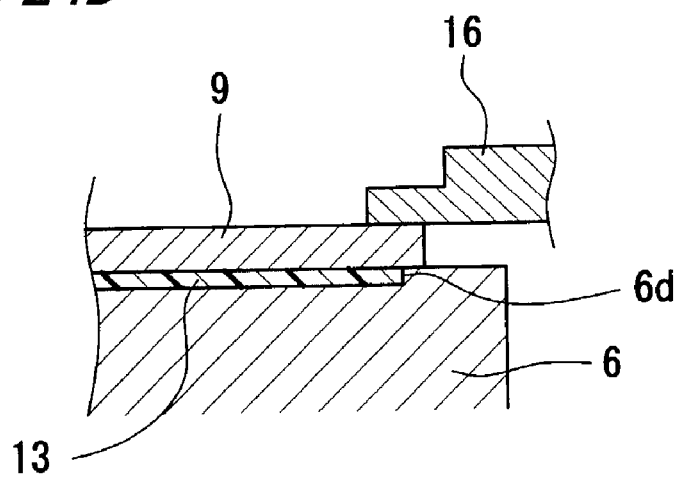
Figure 24C:
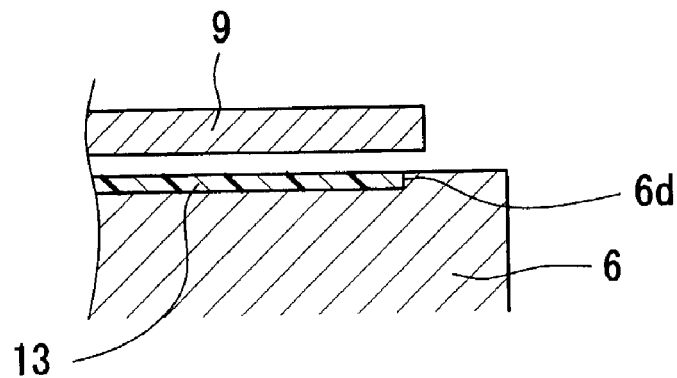

Moreover, as shown in FIGS. 24A and 24B, by disposing an adhesive sheet 13 with interposition of a gap 90 with respect to a recess portion 6d formed on the surface of the substrate electrode 6, and pressing the adhesive sheet 13 together with the substrate 9 by the clamp ring 16, the adhesive sheet 13 may enter the gap 90, thereby preventing formation of a gap of foams or the like between the substrate 9 and the substrate electrode 6. Furthermore, as shown in FIG. 24C, by contracting the adhesive sheet 13 itself without forming the recess portion 6d on the surface of the substrate electrode 6 when the adhesive sheet 13 is pressed together with the substrate 9 by the clamp ring 16, a gap of foams or the like may be prevented from occurring between the substrate 9 and the substrate electrode 6.

Second Embodiment

A second embodiment of the present invention will be described with reference to FIGS. 5 through 17C.

Figure 5:
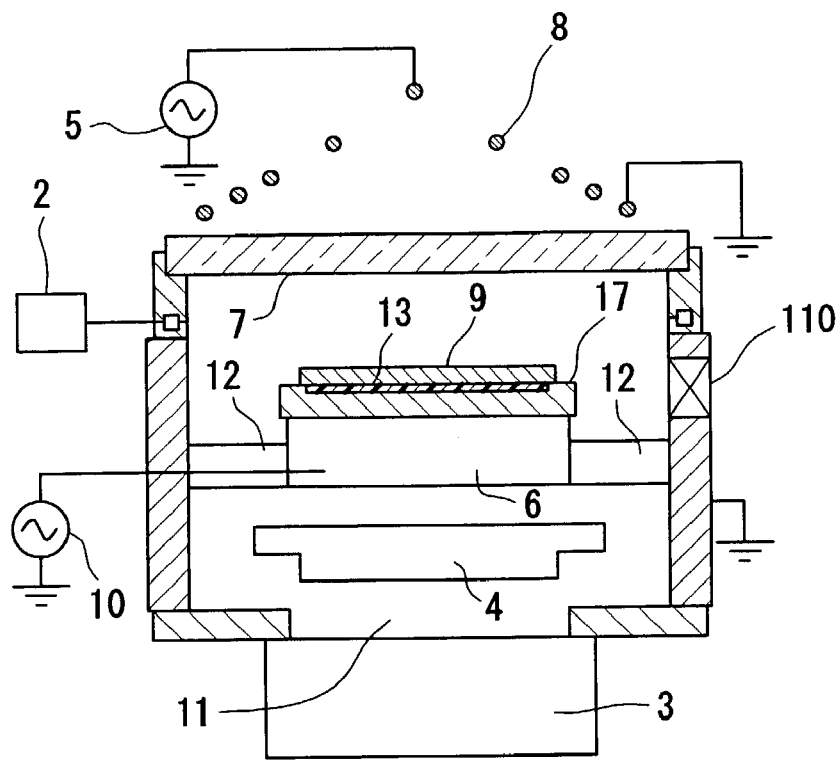
FIG. 5 is a sectional view showing a construction of a plasma processing apparatus used by a plasma processing method according to a second embodiment of the present invention.

FIG. 5 shows a sectional view of a plasma processing apparatus used in the second embodiment of the present invention.

Referring to FIG. 5, by evacuating a vacuum vessel 1 by a turbo-molecular pump 3, as an exhauster, while introducing a specified gas from a gas supply unit 2 into the vacuum vessel 1 and by applying high-frequency power of 13.56 MHz to a coil 8, provided along a dielectric plate 7 opposite to a substrate electrode 6, by a coil use high-frequency power supply 5 while maintaining an interior of the vacuum vessel 1 at a specified pressure by a pressure-regulating valve 4, inductive-coupling type plasma is generated in the vacuum vessel 1, and a substrate 9 placed on the substrate electrode 6 can be subjected to plasma processing.

Moreover, a substrate electrode use high-frequency power supply 10 for supplying high-frequency power to the substrate electrode 6 is provided, thereby allowing ion energy that reaches the substrate 9 to be controlled. The turbo-molecular pump 3 and exhaust port 11 are disposed just under the substrate electrode 6, and the pressure-regulating valve 4 is an up-and-down valve disposed just under the substrate electrode 6 and just over the turbo-molecular pump 3. The substrate electrode 6 is fixed to the vacuum vessel 1 with four props 12.

The substrate 9 is placed on a tray 17, and an adhesive sheet 13 is provided between the tray 17 and the substrate 9, thereby making it possible to perform processing while effecting heat exchange between the substrate 9 and the tray 17 via the adhesive sheet 13. A silicone rubber film is used as the adhesive sheet 13. This adhesive sheet 13 has a thermal conductivity of 0.2 W/m·K, Asker C of 60, hardness of 55, and a thickness of 0.2 mm.

The tray 17 is preferably made of a material, which has a thickness of 2 to 5 mm, is hydrochloric acid resistant and exhibits good thermal conductivity, and on a surface of which an oxide film is formed. The tray is preferably made of aluminum whose surface is processed with alumite as an oxide film.

A recess portion 17a, for accommodating the adhesive sheet 13, provided in the tray 17 may have roughly the same size as that of the adhesive sheet 13 or is greater than the adhesive sheet 13 as described hereinabove as shown in FIGS. 24A and 24B, so that the adhesive sheet 13 can protrude radially outwardly when the substrate 9 is pressed by clamp ring 16.

The substrate 9 and the tray 17 were placed on the substrate electrode 6, and thereafter, a silicon oxide film on the substrate 9 was subjected to an etching process on condition that the vacuum vessel 1 is supplied with $CF_4$ gas at a rate of 5 sccm and Ar gas at a rate of 45 sccm, with a temperature of the substrate electrode 6 maintained at 30° C., and high-frequency power was applied by 500 W to the coil 8 and 200 W to the substrate electrode 6 with an internal pressure of the vacuum vessel 1 maintained at 3 Pa. Consequently, etching was able to be performed at an etching rate of 100 nm/min.

A processing time was 200 seconds including an over-etching time. As a result, burning of a photoresist did not occur, and a satisfactory etching process was able to be performed. When a temperature of the substrate 9 was measured on the same conditions, the temperature of the substrate 9 immediately before an end of the etching was 92° C. For sake of comparison, an etching process was performed on similar conditions by the conventional system (construction having no adhesive sheet). Consequently, burning of the photoresist occurred, and etching failed. Moreover, when a temperature of the substrate 9 was measured on the same conditions, the temperature of the substrate 9 immediately before an end of the etching was 200° C.

As described above, a reason why the temperature of the substrate 9 was significantly lowered in comparison with the prior-art example is that processing is able to be performed while effecting heat exchange between the substrate 9 and the tray 17 via the adhesive sheet 13. That is, it can be considered that a temperature rise due to plasma exposure is reduced since a thermal capacity of the tray 17 is much larger (ten times or more) than the thermal capacity of only the substrate 9. When the tray 17 is used, the temperature of the substrate 9 is disadvantageously made higher than that of the construction of the first embodiment of the present invention using no tray 17. However, by using the tray 17, a possibility of occurrence of a positional shift when the substrate 9 is transported in a vacuum is remarkably reduced. That is, this substrate positional shift might be easily caused with respect to a transportation arm during transportation of only thin light substrate 9. However, by using the tray 17 that has considerable weight and thickness, the substrate positional shift is less likely to occur with respect to the transportation arm during transportation, and this produces an effect of facilitating transportation in a vacuum.

Figure 6:
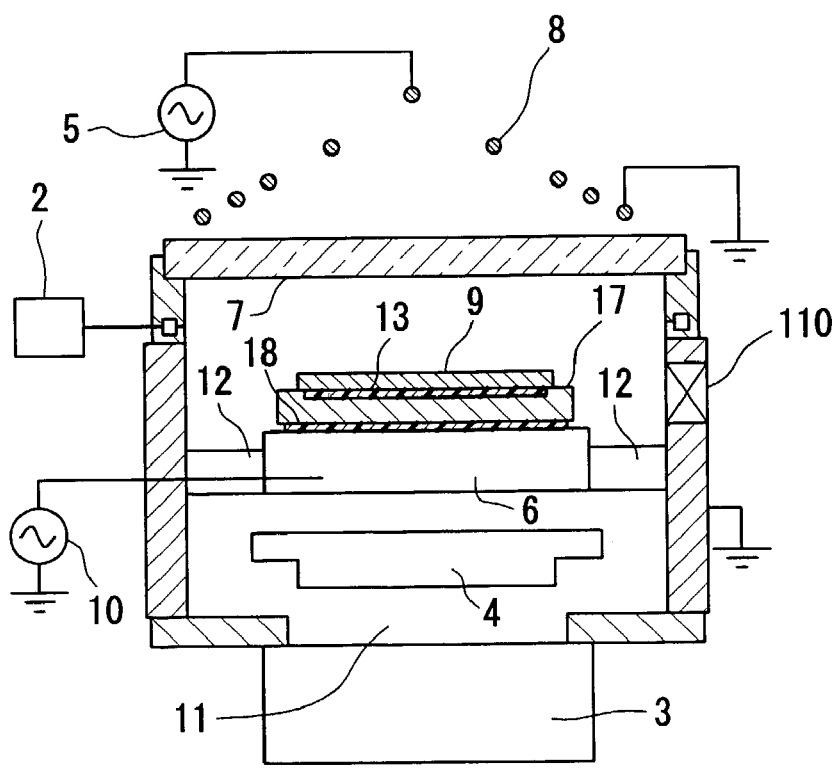
FIG. 6 is a sectional view showing the construction of the plasma processing apparatus used by the plasma processing method of the second embodiment of the present invention.
Figure 7A:
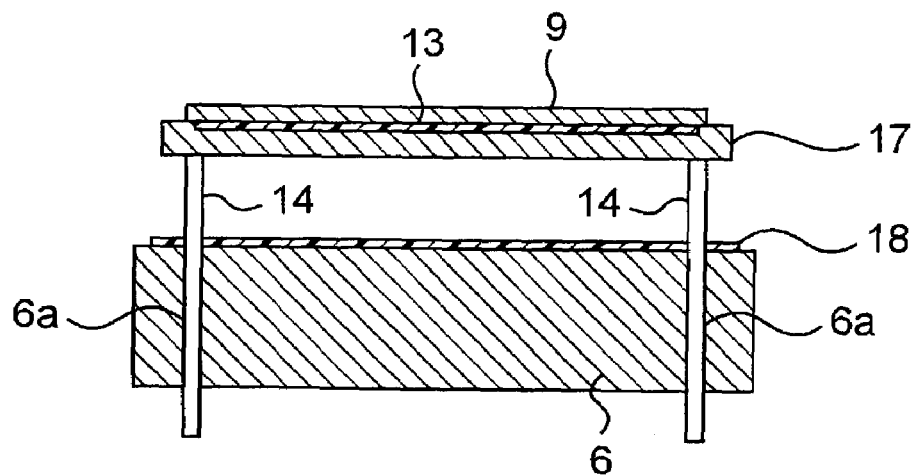
FIGS. 7A and 7B are sectional views showing processes for placing a tray on a substrate electrode according to the plasma processing method of the second embodiment of the present invention.
Figure 7B:
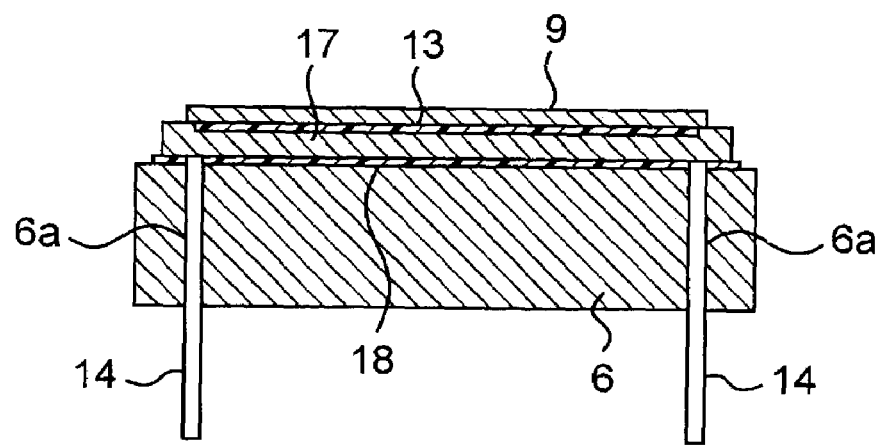

As shown in FIG. 6, by providing an adhesive sheet 18 between the substrate electrode 6 and the tray 17 and performing processing while effecting heat exchange between the substrate electrode 6 and the tray 17 via the adhesive sheet 18, a temperature rise of the substrate 9 can further be suppressed. Regarding such a construction, FIGS. 7A and 7B show processes for placing on the substrate electrode 6 the tray 17 on which the substrate 9 is placed. First of all, the tray 17 on which the substrate 9 is placed is transported into the vacuum vessel 1, and thereafter, the tray 17 is held (FIG. 7A).

Next, lift pins 14 are gradually moved down to bring almost an entire surface of the tray 17 into contact with the adhesive sheet 18 provided on a surface of the substrate electrode 6 (FIG. 7B). If flatness and parallelism of the tray 17 and the substrate electrode 6 are sufficient, then it is feasible to prevent occurrence of a gap between the tray 17 and the adhesive sheet 18.

Figure 8A:
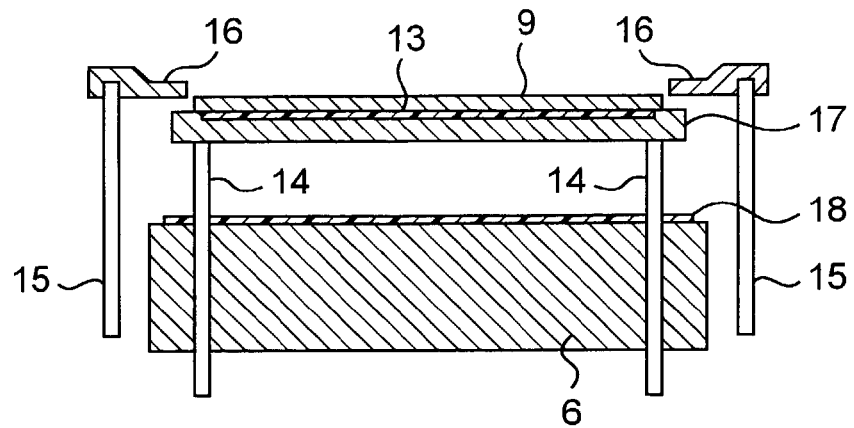
FIGS. 8A, 8B and 8C are sectional views showing processes for placing a tray on a substrate electrode according to the plasma processing method of the second embodiment of the present invention.
Figure 8B:
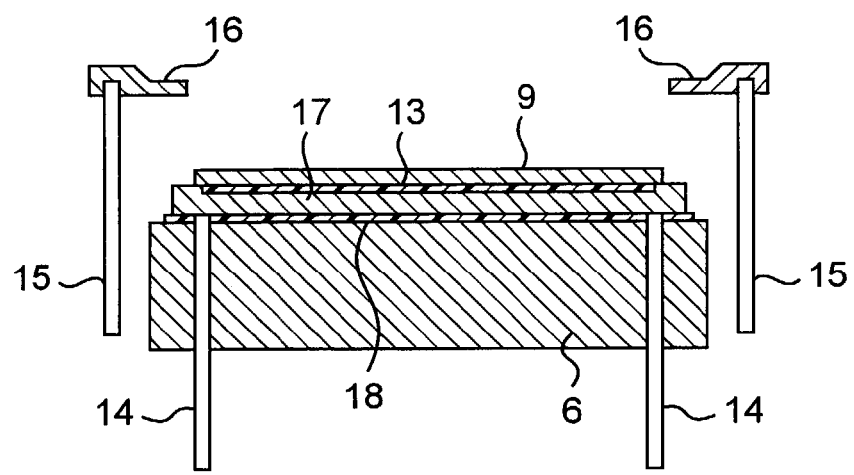
Figure 8C:
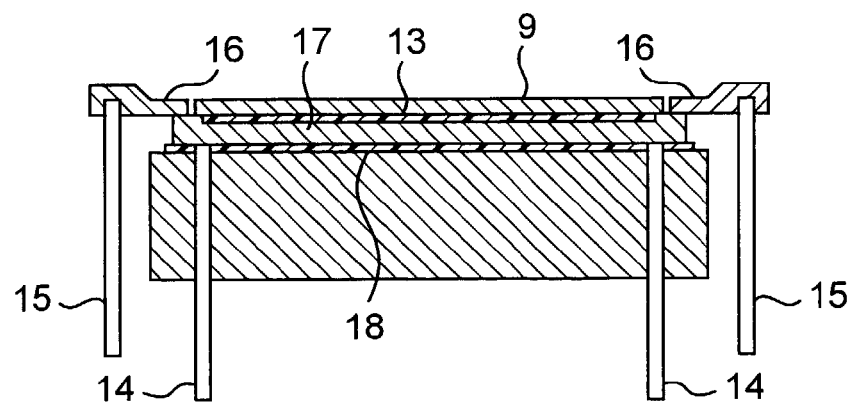

FIGS. 8A through 8C show another example of processes for placing the tray 17 on the substrate electrode 6. First of all, the tray 17 on which the substrate 9 is placed is transported into the vacuum vessel 1, and thereafter, the tray 17 is held (FIG. 8A).

Next, the lift pins 14 are moved down to bring the tray 17 into contact with the adhesive sheet 18 provided on the surface of the substrate electrode 6 (FIG. 8B).

Next, by moving down clamp ring 16 by use of ring elevation rods 15 and pressing an outer peripheral portion of the tray 17 against the substrate electrode 6, almost an entire surface of the tray 17 can be brought into contact with the adhesive sheet 18 provided on the surface of the substrate electrode 6 (FIG. 8C). In this example, it is feasible to more reliably prevent an occurrence of a gap between the tray 17 and the adhesive sheet 18.

It is also acceptable to press an outer peripheral portion of the substrate 9 against the substrate electrode 6 instead of pressing the outer peripheral portion of the tray 17 against the substrate electrode 6. When the substrate 9 is susceptible to a force perpendicular to its surface, it is preferable to press the outer peripheral portion of the tray 17 against the substrate electrode 6 in terms of less damage inflicted on the substrate 9.

Figure 25A:
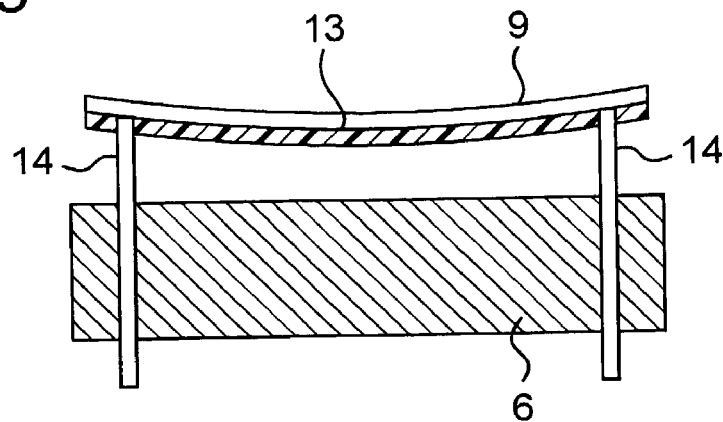
FIGS. 25A, 25B and 25C are explanatory views of a case where an adhesive sheet is transported together with a substrate in a modification example of an embodiment of the present invention.
Figure 25B:
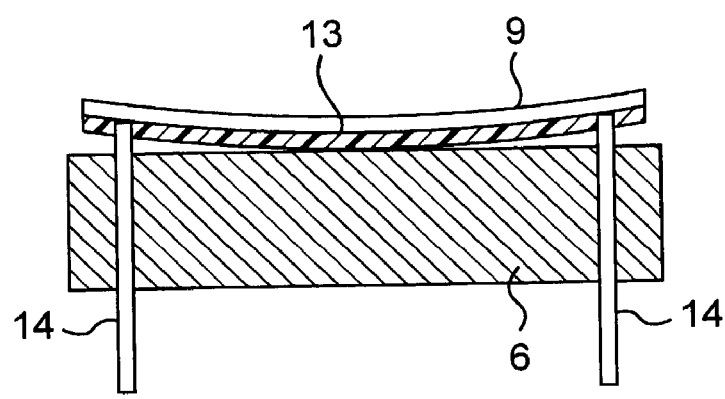
Figure 25C:
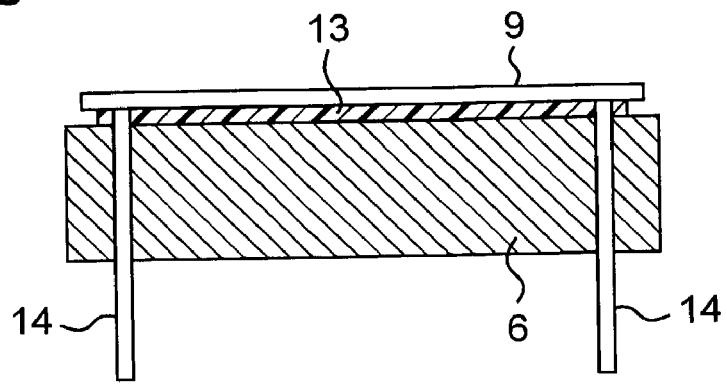

The substrate 9 is transported and placed on the adhesive sheet 13 in the aforementioned embodiments. However, as shown in FIGS. 25A through 25C, it is acceptable to transport the substrate 9 and the adhesive sheet 13 as an integrated body, place the same on a plurality of lift pins 14, place this resulting body on substrate electrode 6 and adhesively fix the same in a state in which the adhesive sheet 13 is preparatorily detachably stuck tightly to a lower surface of the substrate 9 and no foams exist. When the substrate 9 is moved up and down, the plurality of lift pins 14 directly support the substrate 9 penetrating the adhesive sheet 13, and the substrate 9 is allowed to be stably moved up and down. As described above, if the substrate 9 is transported with the adhesive sheet 13 preparatorily stuck to the lower surface of the substrate 9, it is feasible to effectively prevent occurrence of a gap as a consequence of intrusion of foams between the lower surface of the substrate 9 and the adhesive sheet 13 when the substrate 9 is placed on the substrate electrode 6.

Figure 26:
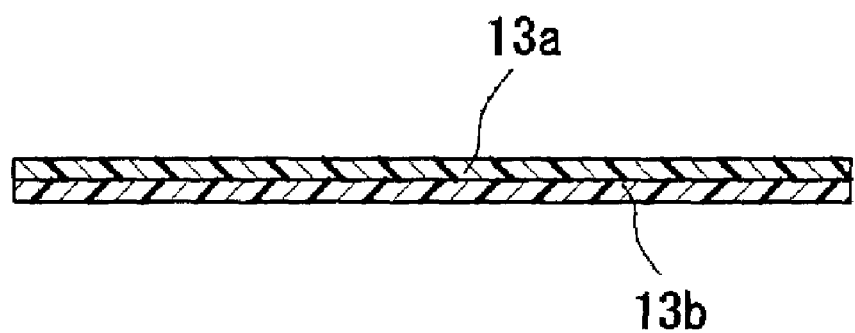
FIG. 26 is an explanatory view of a case where an adhesive sheet is constructed of two layers in a modification example of an embodiment of the present invention.

Moreover, as shown in FIG. 26, the adhesive sheet 13 is not limited to one constructed only of one layer, but is allowed to be constructed of two layers. That is, as shown in FIG. 26, the adhesive sheet 13 may be constructed of two layers of an upper adhesive sheet 13a and a lower adhesive sheet 13b. In this case, when (hardness of upper adhesive sheet 13a>hardness of lower adhesive sheet 13b), the upper adhesive sheet 13a has lower adhesion and abundant detachability. Therefore, this construction is appropriate for an adhesive sheet attached to the upper surface of the electrode or the tray. Conversely, when (hardness of upper adhesive sheet 13a<hardness of lower adhesive sheet 13b), the lower adhesive sheet 13b has lower adhesion and abundant detachability. Therefore, this construction is appropriate for an adhesive sheet attached to the lower surface of the tray or the substrate 9.

Figure 9:
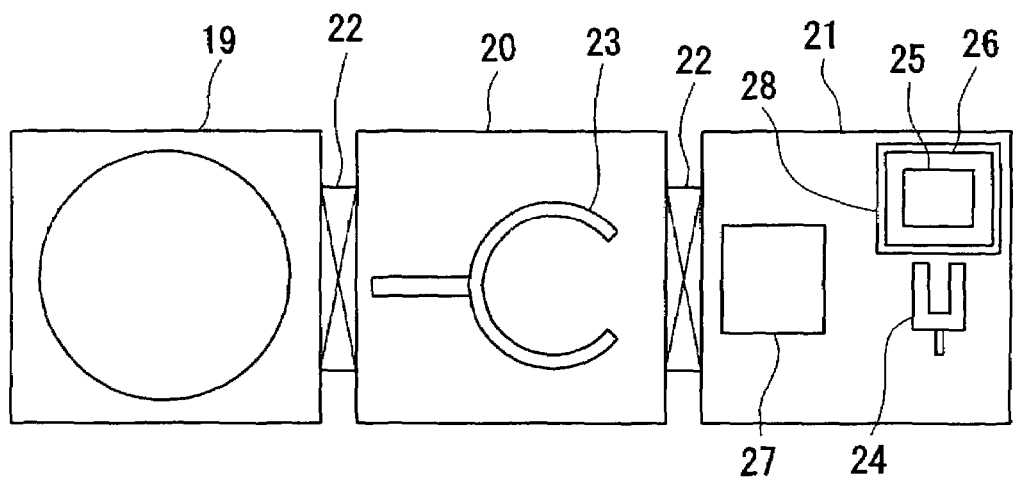
FIG. 9 is a plan view showing an overall construction of the plasma processing apparatus used by the plasma processing method of the second embodiment of the present invention.

FIG. 9 is a plan view showing an overall construction of a plasma processing apparatus used in the second embodiment of the present invention. The apparatus is constructed of three units of a reaction chamber 19 (including the vacuum vessel 1) for performing plasma processing, a load lock chamber 20, and an atmospheric transporting section 21, and these units are partitioned by gate valves 22 that are opening-and-closing gates. The load lock chamber 20 is internally provided with transportation arm 23 and is able to perform reception and delivery of the tray 17 between the atmospheric transporting section 21 and the load lock chamber 20, and reception and delivery of the tray 17 between the reaction chamber 19 and the load lock chamber 20. An atmospheric arm 24 is to receive and deliver the substrate 9 or the tray 17 between the arm and a substrate cassette 25 or a tray cassette 26.

Figure 10:
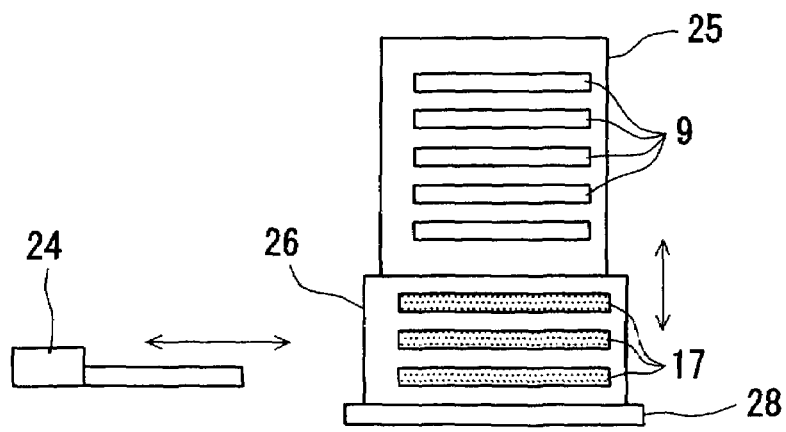
FIG. 10 is a sectional view showing operation of an atmospheric arm and a cassette according to the plasma processing method of the second embodiment of the present invention.

The atmospheric arm 24 performs the reception and delivery of the substrate 9 or the tray 17 between the arm 24 and substrate placement station 27 for placing the substrate 9 on the tray 17, on the surface of which the adhesive sheet 13 is provided. The substrate cassette 25 and the tray cassette 26 are provided on a cassette elevation table 28. When the atmospheric arm 24 receives and delivers the substrate cassette 25 or the tray cassette 26 and the substrate 9 or the tray 17, the atmospheric arm 24 performs a back-and-forth motion as shown in FIG. 10, while the cassette elevation table 28 moves up and down in accordance with appropriate timing.

Figure 11A:
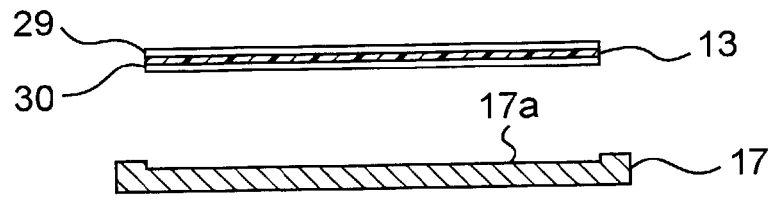
FIGS. 11A, 11B, 11C, 11D and 11E are sectional views showing a procedure for sticking an adhesive sheet to a tray according to the plasma processing method of the second embodiment of the present invention.

FIGS. 11A through 11E show a procedure for sticking the adhesive sheet 13 to the tray 17. First of all, the tray 17 and the adhesive sheet 13, whose both surfaces are covered with protection films 29 and 30, are prepared (FIG. 11A).

Figure 11B:
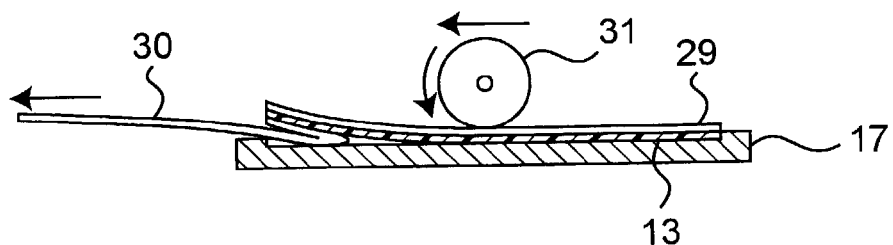
Figure 11C:
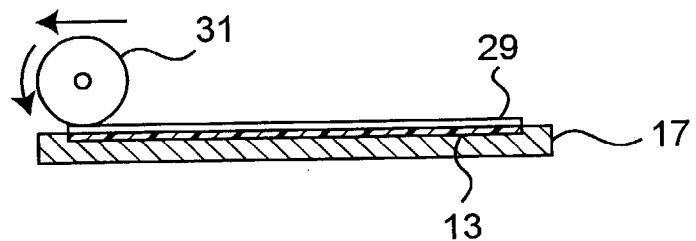

Next, part of the protection film 30 is peeled off and brought into contact with a bottom surface of an adhesive sheet-disposing recess portion 17a of the tray 17, and a roller 31 is subsequently rotated on the protection film 29 while tensioning one end of the protection film 30, thus sticking the adhesive sheet 13 inside the adhesive sheet-disposing recess portion 17a of the tray 17 (FIGS. 11B and 11C).

Figure 11D:
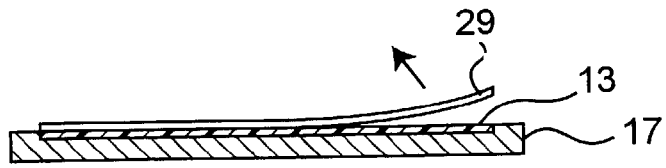

Next, the protection film 29 is peeled off (FIG. 11D).

Figure 11E:
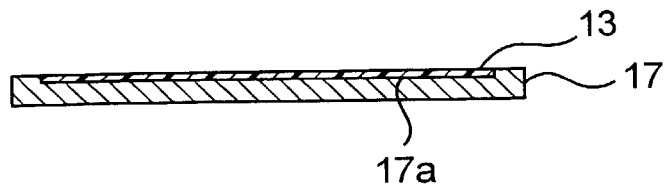

The tray 17, which is provided with the adhesive sheet 13 on its surface on which the substrate 9 is to be placed, can be obtained according to the aforementioned procedure (FIG. 11E).

Figure 12A:
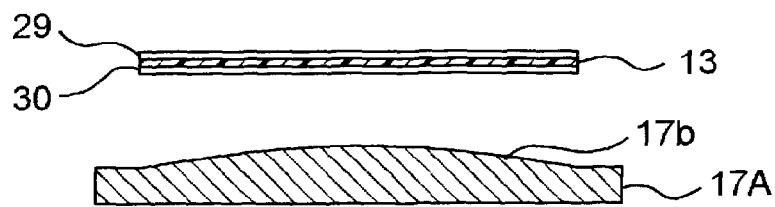
FIGS. 12A, 12B, 12C, 12D and 12E are sectional views showing a procedure for sticking an adhesive sheet to a tray according to the plasma processing method of the second embodiment of the present invention.

In order to improve adhesion between the substrate 9 and the tray 17 in the process for placing the substrate 9 on the tray 17, it is sometimes preferable that used is a tray 17A having a convex shape having a surface of a convex portion 17b whose central portion in a lateral direction is curved and protruded. FIGS. 12A through 12E show a procedure for sticking adhesive sheet 13 to the tray 17A in this case. First of all, convex tray 17A and the adhesive sheet 13, whose both surfaces are covered with protection films 29 and 30, are prepared (FIG. 12A).

Figure 12B:
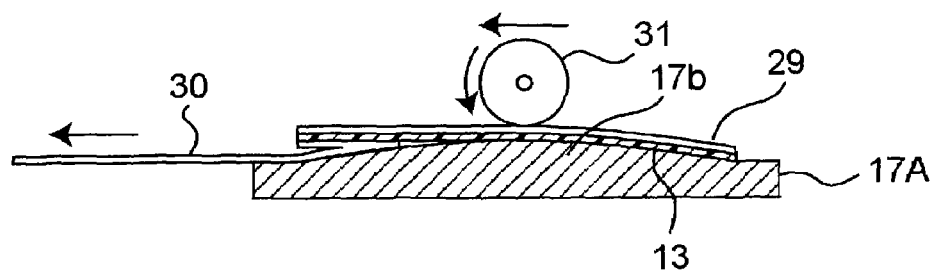
Figure 12C:
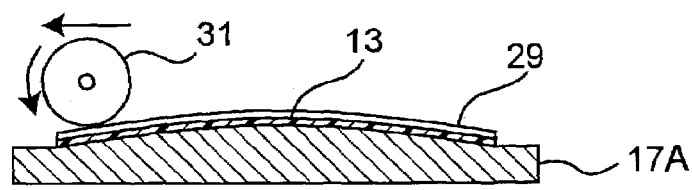

Next, part of the protection film 30 is peeled off and brought into contact with the tray 17A, and a roller 31 is subsequently rotated on the protection film 29 while tensioning one end of the protection film 30, thus sticking the adhesive sheet 13 to the tray 17A (FIGS. 12B and 12C).

Figure 12D:
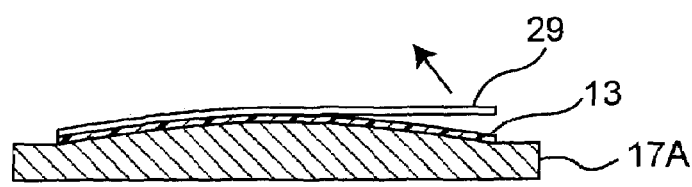
Figure 12E:
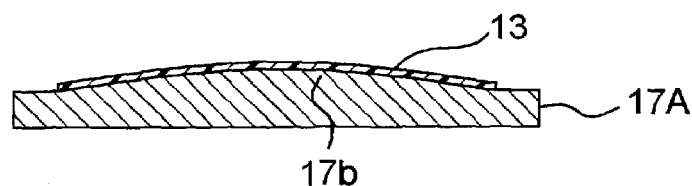

Next, the protection film 29 is peeled off (FIG. 12D). The convex tray 17A, which is provided with the adhesive sheet 13 on its surface on which the substrate 9 is to be placed, can be obtained according to the aforementioned procedure (FIG. 12E).

Figure 27:
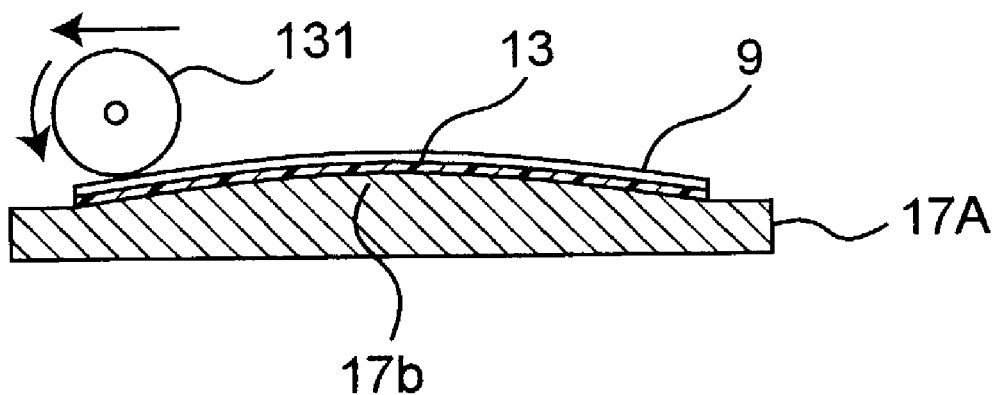
FIG. 27 is an explanatory view for explaining a state in which a substrate is placed on an adhesive sheet of a tray and thereafter a roller is rotated on the substrate in a modification example of an embodiment of the present invention.

As shown in FIG. 27, it is acceptable to place the substrate 9 on the adhesive sheet 13 of the tray 17A and rotate the roller 131 on the substrate 9 for removal of a gap between the substrate 9 and the adhesive sheet 13.

FIG. 13 and FIGS. 14A through 14C show another example of processes for placing the substrate 9 on the tray 17.

Figure 13:
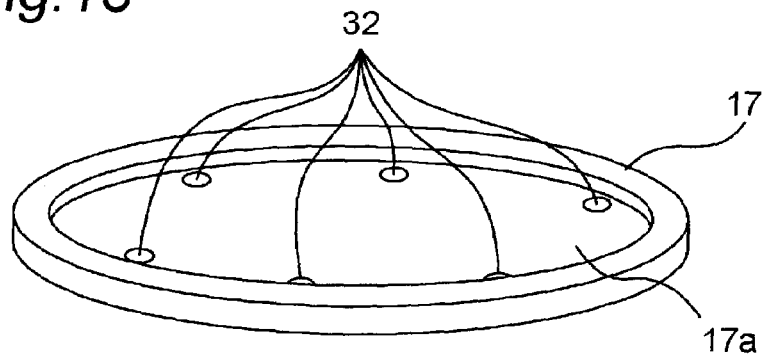
FIG. 13 is a perspective view of a tray according to the plasma processing method of the second embodiment of the present invention.
Figure 14A:
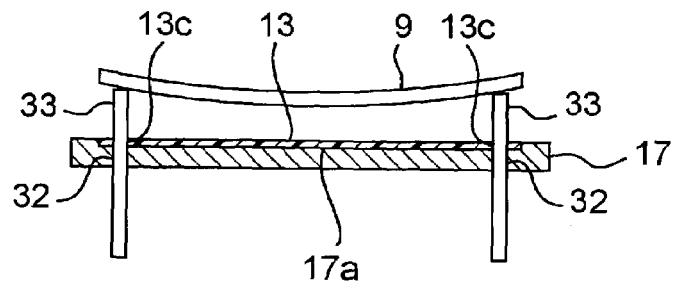
FIGS. 14A, 14B and 14C are sectional views showing processes for placing a substrate on a tray according to the plasma processing method of the second embodiment of the present invention.
Figure 14B:
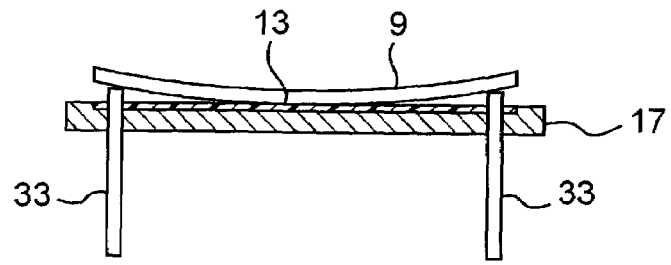

FIG. 13 is a perspective view of the tray 17, in which through holes 32 for receiving lift pins 33 are provided at, for example, a bottom surface of adhesive sheet-disposing recess portion 17a. First of all, the tray 17 and the substrate 9 are transported onto the substrate placement station 27 (see FIG. 9), and thereafter, the substrate 9 is held above the tray 17 (FIG. 14A). At this time, the lift pins 33 that move up and down inside the through holes 32 provided in the tray 17 are disposed in the vicinity of an outer peripheral portion of the tray 17. Therefore, the substrate 9 is deformed in a convex shape protruding toward the tray 17. Next, the lift pins 33 are gradually moved down, and a neighborhood of a center of the substrate 9 is brought into contact with adhesive sheet 13 provided on a surface of the tray 17 (FIG. 14B).

Figure 14C:
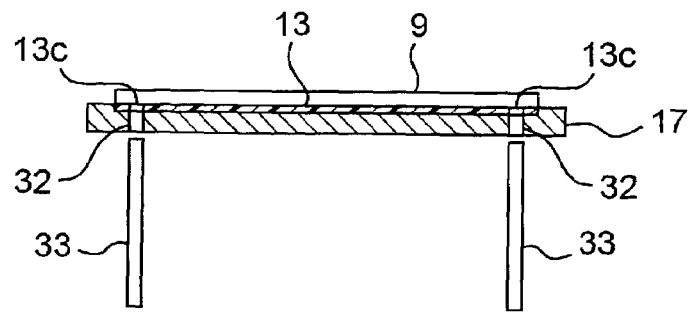

By further moving down the lift pins 33, almost an entire surface of the substrate 9 can be brought into contact with the adhesive sheet 13 provided on the surface of the tray 17 (FIG. 14C).

By using the aforementioned procedure, it is feasible to prevent occurrence of a gap between the substrate 9 and the adhesive sheet 13 (in other words, no foams enter).

Figure 15A:
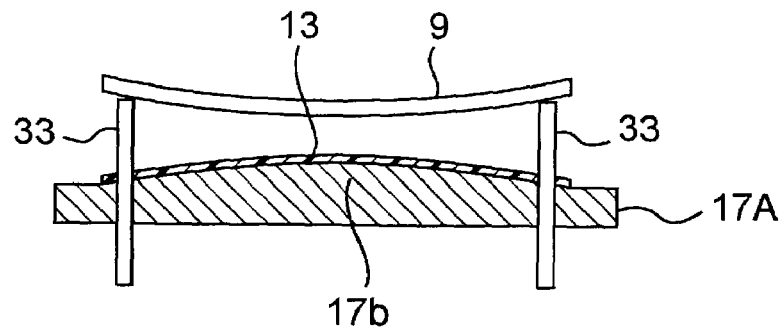
FIGS. 15A, 15B and 15C are sectional views showing processes for placing a substrate on a tray according to the plasma processing method of the second embodiment of the present invention.
Figure 15B:
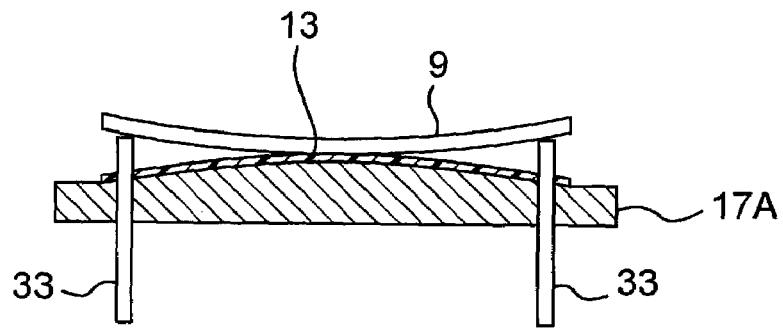
Figure 15C:
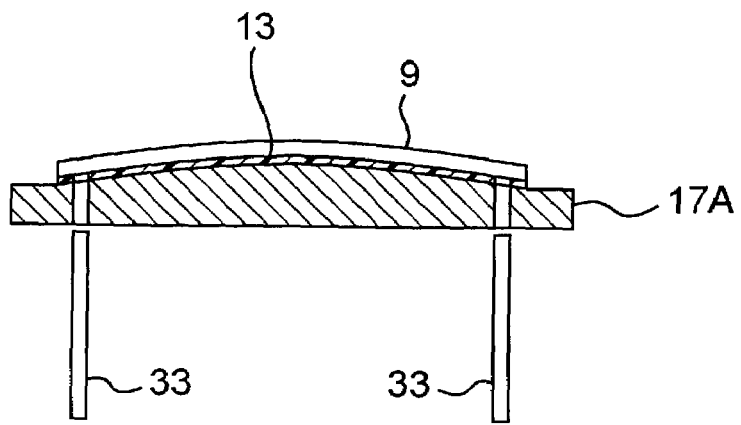

FIGS. 15A through 15C show another example of processes for placing substrate 9 on tray 17A. First of all, the tray 17A and the substrate 9 are transported onto the substrate placement station 27 (see FIG. 9), and thereafter, the substrate 9 is held above the tray 17A (FIG. 15A). At this time, lift pins 33, which move up and down in through holes 32 provided in the tray 17A, are disposed in the vicinity of an outer peripheral portion of the tray 17A. Therefore, the substrate 9 is deformed in a convex shape protruding toward the tray 17A.

Next, the lift pins 33 are gradually moved down, and a neighborhood of a center of the substrate 9 is brought into contact with adhesive sheet 13 provided on a surface of the tray 17A (FIG. 15B).

By further moving down the lift pins 33, almost an entire surface of the substrate 9 can be brought into contact with the adhesive sheet 13 provided on the surface of the tray 17A (FIG. 15C). In this example, since convex tray 17A is employed, even in handling a substrate 9 that is less prone to deformation, the substrate can reliably be brought into contact with the adhesive sheet 13 initiatively from the neighborhood of the center of the substrate 9, and a possibility of an occurrence of a gap between the substrate 9 and the adhesive sheet 13 can be reduced.

Figure 16A:
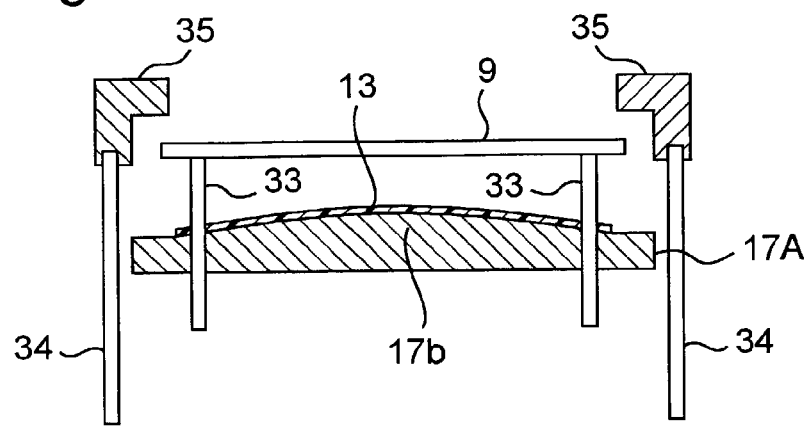
FIGS. 16A, 16B and 16C are sectional views showing processes for placing a substrate on a tray according to the plasma processing method of the second embodiment of the present invention.
Figure 16B:
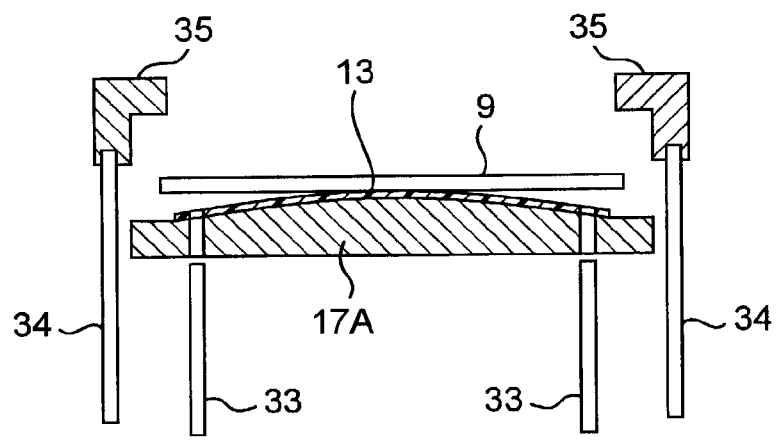
Figure 16C:
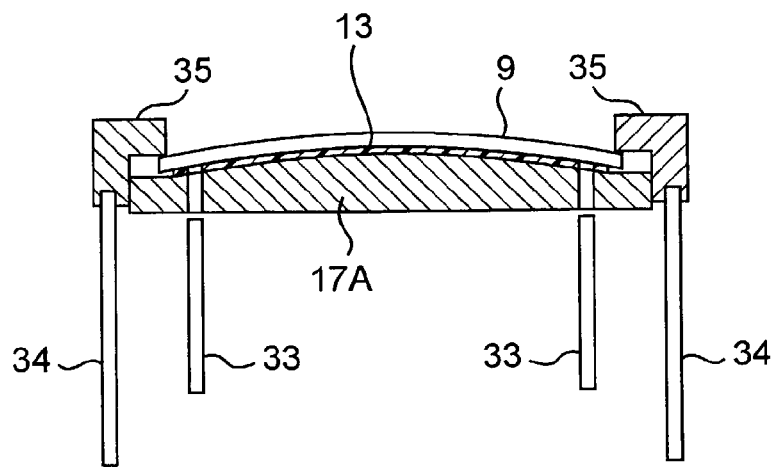

FIGS. 16A through 16C show yet another example of processes for placing substrate 9 on tray 17A. The tray 17A and the substrate 9 are transported onto the substrate placement station 27 (see FIG. 9), and thereafter, the substrate 9 is held above the tray 17A (FIG. 16A). In this example, the substrate 9 is made of a material that is less prone to deformation, and therefore, a degree of deformation of the substrate 9 protruding toward the tray 17A is remarkably less than in the case of FIGS. 14A through 14C and FIGS. 15A through 15C.

Next, lift pins 33 are moved down, and a neighborhood of a center of the substrate 9 is brought into contact with adhesive sheet 13 provided on a surface of the convex tray 17A (FIG. 16B).

Next, by moving down a frame-shaped or rod-shaped clamping jig 35 capable of contacting an outer peripheral portion of the substrate 9 with use of a plurality of jig elevation bars 34, and then pressing the outer peripheral portion of the substrate 9 against the tray 17A, almost an entire surface of the substrate 9 can be brought into contact with the adhesive sheet 13 provided on the surface of the tray 17A (FIG. 16C).

In this example, since convex tray 17A is employed, even in handling a substrate 9 that is less prone to deformation, the substrate 9 can reliably be brought into contact with the adhesive sheet 13 initiatively from the neighborhood of the center of substrate 9, and a possibility of occurrence of a gap between the substrate 9 and the adhesive sheet 13 can be reduced. When transporting the tray 17A into the vacuum vessel 1, it is preferable to transport the tray 17A with the outer peripheral portion of the substrate 9 kept pressed against the tray 17A by the clamping jig 35.

Figure 17A:
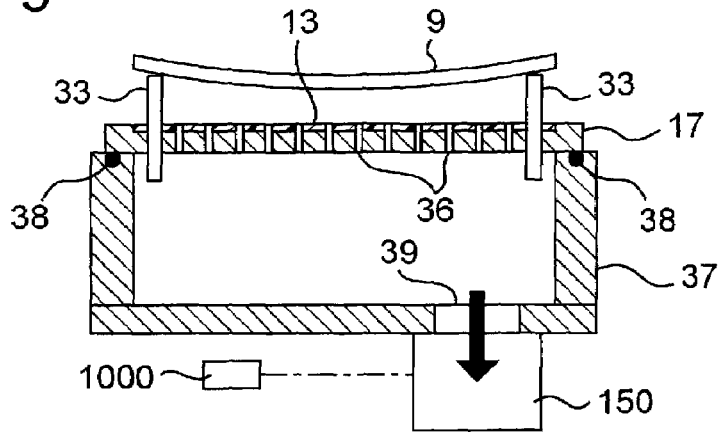
FIGS. 17A, 17B and 17C are sectional views showing processes for placing a substrate on a tray according to the plasma processing method of the second embodiment of the present invention.
Figure 17B:
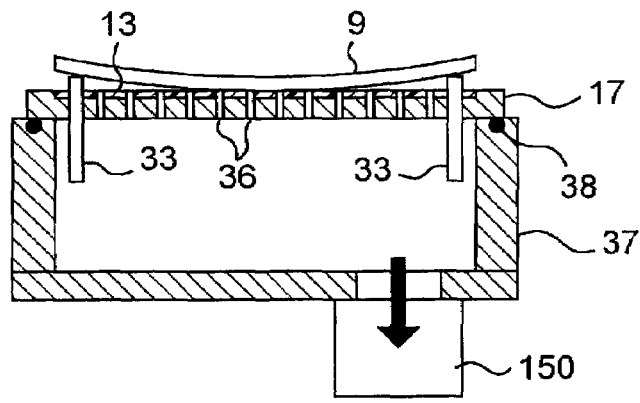
Figure 17C:
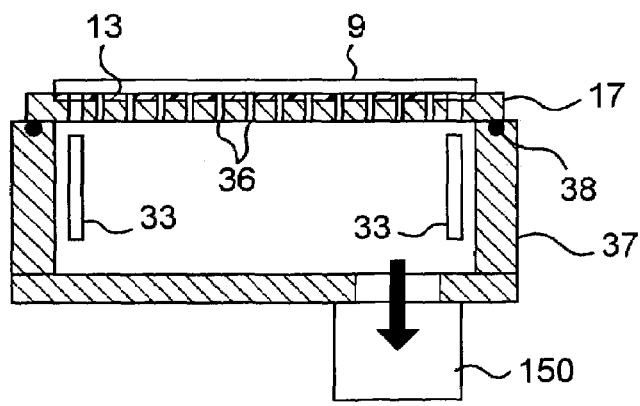

FIGS. 17A through 17C show yet another example of processes for placing substrate 9 on tray 17. First of all, the tray 17 and the substrate 9 are transported onto the substrate placement station 27 (see FIG. 9), and thereafter, the substrate 9 is held above the tray 17 (FIG. 17A). In this example, exhaust holes 36 are provided in the tray 17. Then, lift pins 33 are moved down while exhausting gas between the substrate 9 and the tray 17 by an exhausting unit 150, and a neighborhood of a center of the substrate 9 is brought into contact with adhesive sheet 13 provided on a surface of the tray 17 (FIG. 17B).

By further moving down the lift pins 33, almost an entire surface of the substrate 9 can be brought into contact with the adhesive sheet 13 provided on the surface of the tray 17 (FIG. 17C). In this example, contact processes are performed while exhausting gas between the substrate 9 and the tray 17, and therefore, a possibility of occurrence of a gap between the substrate 9 and the adhesive sheet 13 is low, and there is an advantage in that foams are less likely to occur between the substrate 9 and the adhesive sheet 13.

It is noted that the substrate placement station 27 (see FIG. 9) may also be provided within a second vacuum vessel. In this case also, there is an advantage in that foams are less likely to intervene between the substrate 9 and the adhesive sheet 13.

Figure 28:
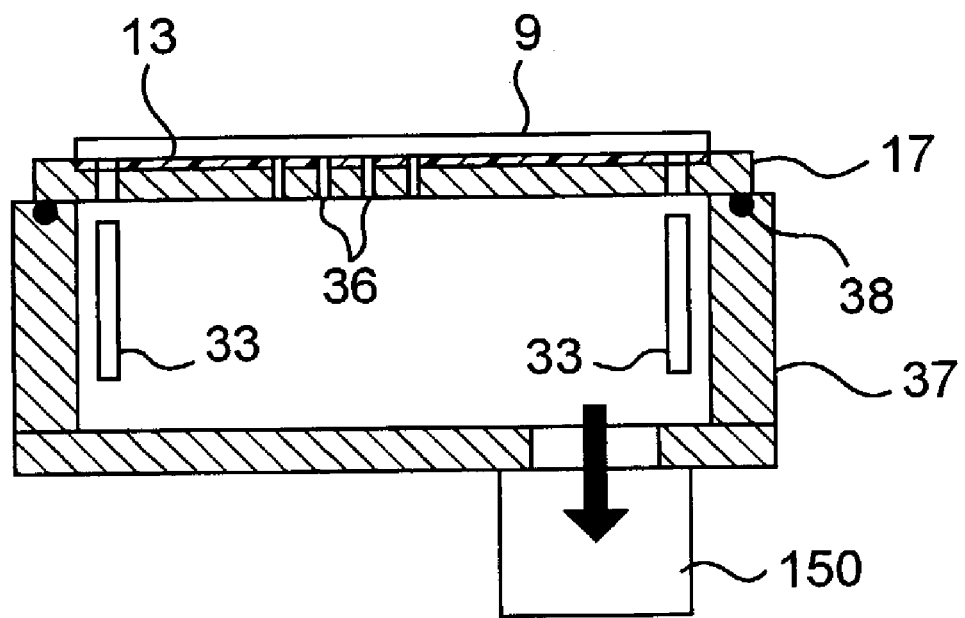
FIG. 28 is an explanatory view for explaining a case where exhaust holes are provided only in a central portion of a tray in a modification example of an embodiment of the present invention.

It is also possible that exhaust holes 36 are provided only in a central portion of the tray 17, as shown in FIG. 28, so that the substrate 9 is sucked at only its central portion to the adhesive sheet 13 so as to be affixable thereto sequentially from the central portion to the peripheral portion of the substrate 9, thus making it implementable to eliminate gaps or foams more effectively.

The foregoing embodiments of the present invention have been described only by way of example to illustrate some of many variations as to the configuration of the vacuum vessel (chamber), the system and arrangement of the plasma source, and the like within the application range of the present invention. It is needless to say that many other variations besides those illustrated above are conceivable for application of the present invention.

Although the foregoing embodiments have been described exemplarily for a case where the present invention is applied to dry etching, the present invention is of course applicable to CVD, sputtering, or other plasma processing.

Further, the foregoing embodiments have been described exemplarily for a case where the internal pressure of the vacuum vessel is 3 Pa. However, since it is over a pressure range generally from 0 to 500 Pa or lower that heat exchange between a substrate and a substrate electrode, between a substrate and a tray, or between a tray and a substrate electrode matters in the prior art example, the present invention is particularly effective for such temperatures within this pressure range.

Further, although the foregoing embodiments have been described exemplarily for a case where a film on the substrate placed on the tray is processed, the present invention is applicable also to cases where the substrate itself is processed.

Figure 18:
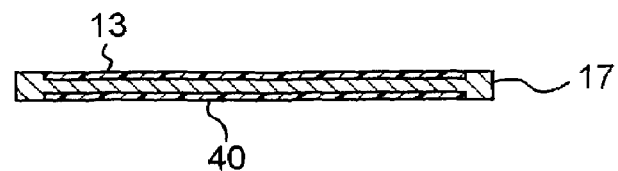
FIG. 18 is a sectional view showing a construction of a tray according to one embodiment of the present invention.
Figure 19:
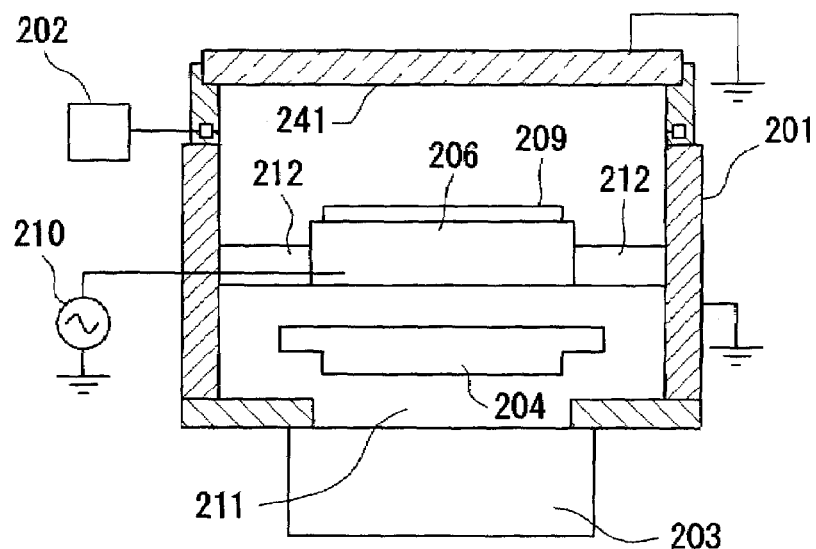
FIG. 19 is a sectional view showing a construction of a plasma processing apparatus used in a prior-art example.
Figure 20:
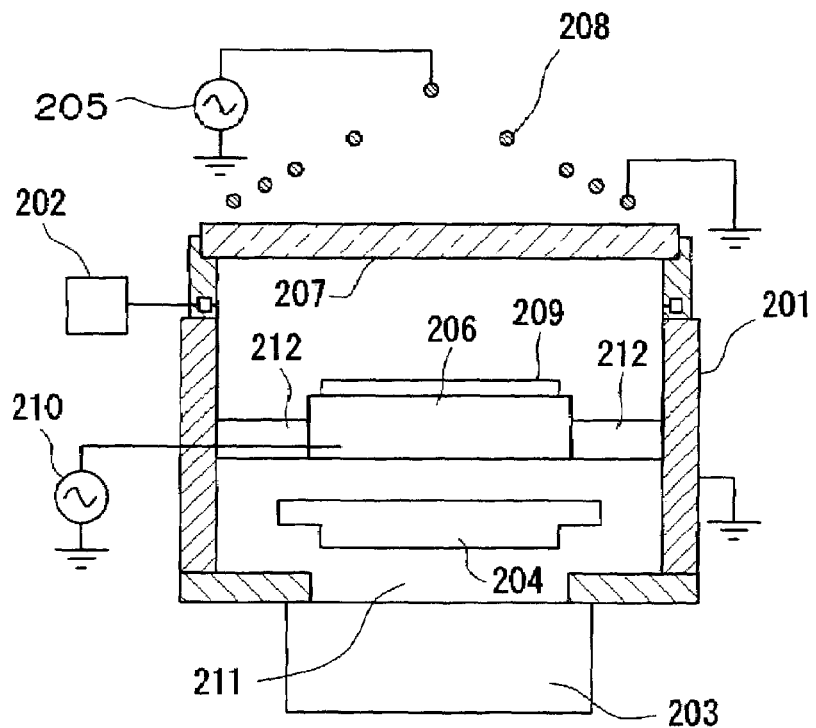
FIG. 20 is a sectional view showing a construction of a plasma processing apparatus used in a prior-art example.

Further, although the foregoing embodiments have been described exemplarily for a case where an adhesive sheet is provided on one side of the tray, it is also possible that adhesive sheets are provided on both sides of the tray as shown in FIG. 18. In this case, there is no need for providing any adhesive sheet on the surface of the substrate electrode, thus making it easier to replace the adhesive sheets, advantageously.

Further, the foregoing embodiments have been described exemplarily for a case where thermal conductivity of the adhesive sheet is 0.2 W/m·K. However, for enhancement of heat exchange between a substrate and a substrate electrode, between a substrate and a tray or between a tray and a substrate electrode, the thermal conductivity of the adhesive sheet is preferably not less than 0.1 W/m·K.

Further, the foregoing embodiments have been described exemplarily for a case where the ASKER C of the adhesive sheet is 60. However, for enhancement of heat exchange between a substrate and a substrate electrode, between a substrate and a tray, or between a tray and a substrate electrode, the ASKER C of the adhesive sheet is preferably not more than 80. With the ASKER C larger than 80, adhesiveness would become poorer, thereby causing heat exchangeability to lower.

Further, the foregoing embodiments have been described exemplarily for a case where hardness of the adhesive sheet is 55. However, for enhancement of heat exchange between a substrate and a substrate electrode, between a substrate and a tray, or between a tray and a substrate electrode, the hardness of the adhesive sheet is preferably 50 to 60. With the hardness of the adhesive sheet being lower than 50, the adhesive sheet would be too soft, thereby allowing foams to easily enter into an adhesion surface. Conversely, with the hardness of the adhesive sheet being higher than 60, the adhesive sheet would be too hard, resulting in poorer adhesiveness.

Further, the foregoing embodiments have been described exemplarily for a case where thickness of the adhesive sheet is 0.2 mm. However, for enhancement of heat exchange between a substrate and a substrate electrode, between a substrate and a tray, or between a tray and a substrate electrode, the thickness of the adhesive sheet is preferably 0.05 to 0.5 mm. With the thickness of the adhesive sheet being smaller than 0.05 mm, the adhesive sheet would be less easy to handle, thereby making it difficult to perform the step of affixing the adhesive sheet to the substrate electrode or the tray, while the adhesive sheet itself would be insufficient in terms of a cushioning property, thereby making it difficult to obtain flatness, with a result of deteriorated cooling efficiency. Conversely, with the thickness of the adhesive sheet being larger than 0.5 mm, a thermal resistance would be become larger, thereby causing heat exchangeability to lower.

Further, although the foregoing embodiments have been described exemplarily for a case where the substrate is made of polyimide resin, the present invention is applicable to cases where various substrates are used. With an electrically conductive substrate being used, there is a possibility that a temperature of the substrate can be controlled to some extent by electrostatic suction. Therefore, the present invention is effective particularly when the substrate is a dielectric. Examples of such cases may include cases where the substrate is made of glass, ceramics, a resin sheet, or the like.

Further, the foregoing embodiments have been described exemplarily for a case where a thickness of the substrate is 0.4 mm. However, the present invention is particularly effective when the thickness of the substrate is 0.001 to 1 mm, and further particularly effective when the thickness of the substrate is 0.001 to 0.5 mm. With the thickness of the substrate being less than 0.001 mm, substrate conveyance becomes difficult to perform. Conversely, with the thickness of the substrate being more than 1 mm, the substrate is large in terms of thermal capacity, so that temperature change of the substrate under processing becomes relatively small. With high-frequency power being small (e.g., about 100 W), even if the thickness of the substrate is 0.5 mm to 1 mm, the substrate is large in terms of thermal capacity, so that a temperature change of the substrate under processing becomes relatively small. Otherwise, with use of a large-scale, thin and solid, crack-prone substrate (silicon, glass, ceramics and the like), especially when the substrate has a thickness of not more than 1 mm and an area of not less than 0.1 $m^2$, it is difficult to use gas as a heating medium as described in the prior art, and therefore the present invention is particularly effective.

Further, the foregoing embodiments have been described exemplarily for a case where the substrate has a thickness h of 0.0004 m, a Young's modulus E of 3 GPa, a Poisson's ratio $v$ of 0.3, and a circular shape having a diameter a of 0.15 m. However, the present invention is a plasma processing method which is effective particularly when $600 \times (1-v^2) a^4/(256 \times Eh^3) > 0.005$ (m), where E (Pa) is substrate's Young's modulus, $v$ is substrate's Poisson's ratio, a (m) is substrate's characteristic length, and h (m) is substrate's thickness. That is, the present invention produces particularly large effects when such substrates as those satisfying the above relational expression are processed.

Generally, given that a disc has a Young's modulus of E (Pa), a Poisson's ratio of $v$, a diameter of a (m), and a thickness of h (m), a uniformly distributed load of p (Pa), when applied to the disc with the disc fixed at its periphery, results in a flexure amount of $3 \times (1-v^2) pa^4/(256-Eh^3)$ (m) at a center of the disc. As is known, generally, gas pressure of at least 200 Pa is necessary in order to fulfill temperature control of the substrate by feeding gas serving as a heating medium to between the substrate and the substrate electrode with the substrate fixed at its periphery by a clamp ring.

Accordingly, a substrate satisfying the expression that $600 \times (1-v^2) a^4/(256 \times Eh^3) > 0.005$ means a substrate which has its periphery fixed and which would result in a flexure of at least 0.005 m (=5 mm) with application of a 200 Pa gas pressure. Occurrence of such large deformation might not only impair uniformity of processing but also cause occurrence of abnormal discharge in a space formed between the substrate and the substrate electrode, and additionally might cause a device formed on the substrate to be broken by stress.

The above description has been made for a circular-shaped substrate. Otherwise, also for rectangular or other shapes, a range over which the present invention produces great application effects can be defined, in terms of their characteristic length a (e.g., diagonal line of a rectangular shape), approximately by the expression that $600 \times (1-v^2) a^4/(256 \times Eh^3) > 0.005$. Conversely, in a case of substrates which do not satisfy the above expression, those substrates are less liable to deformation even with use of gas as a heating medium and therefore, in some cases, may be processed by conventional methods without a need for applying the present invention.

Figure 31:
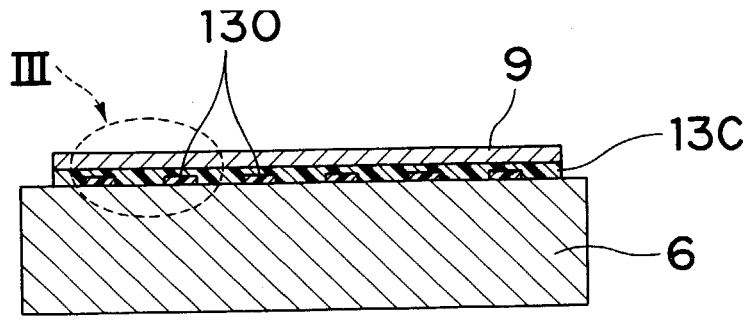
FIG. 31 is a cross-sectional view of a case where an adhesive sheet is placed on an uneven surface defined by plural resin tapes and a substrate electrode in another modification example of an embodiment of the present invention.
Figure 32:
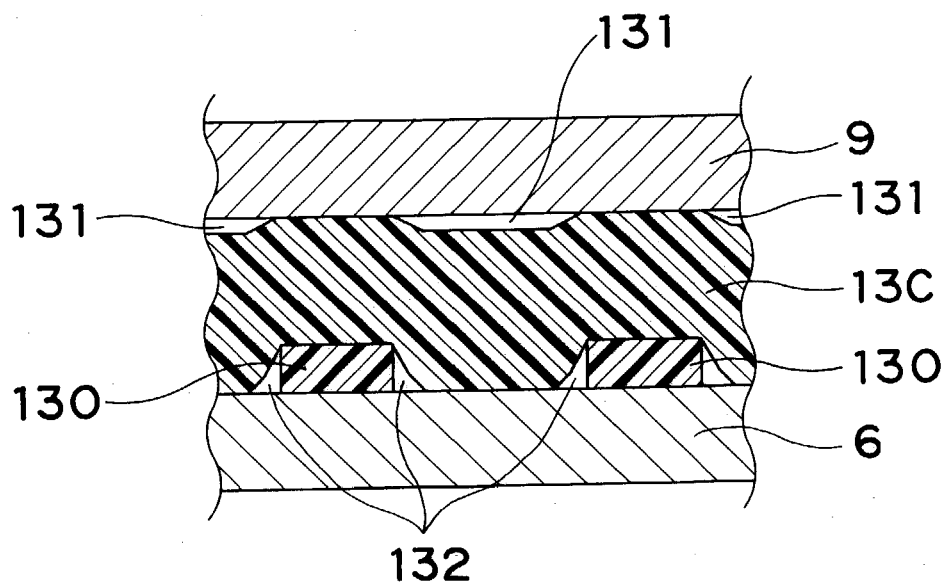
FIG. 32 is an enlarged view of circle portion III in FIG. 31.
Figure 33:
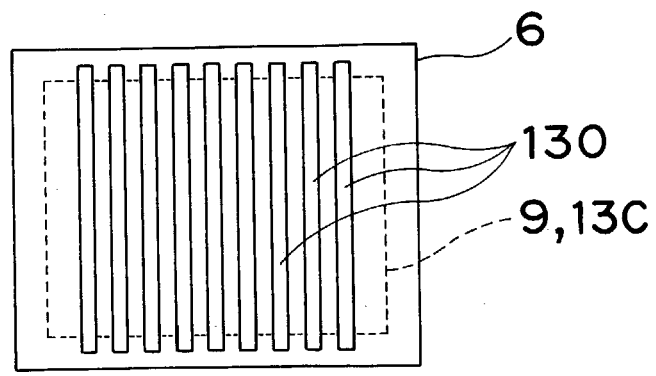
FIG. 33 is a plan view of a case of FIG. 31 before the adhesive sheet is placed on the uneven surface.

Another modification example of an above embodiment of the present invention is shown in FIGS. 31–33. In FIGS. 31–33, a plurality of resin tapes 130 are arranged on a surface of substrate electrode 6 via specified gaps, and then an adhesive sheet 13C is arranged on the plurality of resin tapes 130 and the surface of the substrate electrode 6 to fix the adhesive sheet 13C onto the plurality of resin tapes 130 and the surface of the substrate electrode 6 with an adhesive force of the adhesive sheet 13C. In this state, approximately strip-shaped spaces 132 are formed between each resin tape 130 and the adhesive sheet 13C on both sides of each resin tape 130, whereas onto an upper surface of the adhesive sheet 13C, an uneven shape defined by the plurality of resin tapes 130 is transferred via the adhesive sheet 13C itself, while a difference level of the uneven shape defined by the plurality of resin tapes 130 is reduced slightly, resulting in obtaining an uneven upper surface of the adhesive sheet 13C.

As shown in FIG. 33, both ends of each resin tape 130 are projected outside of an area where the adhesive sheet 13C is located, and thus, both ends of the approximately strip-shaped spaces 132 defined between each resin tape 130 and the adhesive sheet 13C are opened at a periphery of the adhesive sheet 13C, without being closed by the adhesive sheet 13C. As a result, in sticking the adhesive sheet 13C to the substrate electrode 6, air in the approximately strip-shaped spaces 132 on a substrate electrode side is discharged through the approximately strip-shaped spaces 132 when an interior of a vacuum vessel is evacuated, resulting in prevention of any deformation of the adhesive sheet 13C due to expansion of foams.

When a substrate 9 is placed on the uneven upper surface of the adhesive sheet 13C to fix the substrate 9 to the adhesive sheet 13C with adhesive force of the adhesive sheet 13C, approximately strip-shaped spaces 131 are defined by the uneven upper surface of the adhesive sheet 13C and a lower surface of the substrate 9 while both ends of the spaces 131 are opened in their longitudinal directions. Therefore, when the substrate 9 is placed on the adhesive sheet 13C, air in the approximately strip-shaped spaces 131 is discharged through the approximately strip-shaped spaces 131 when the interior of the vacuum vessel is evacuated, resulting in prevention of any deformation of the adhesive sheet 13C due to expansion of foams.

In order to form such an uneven upper surface of the adhesive sheet 13C, instead of provision of the plural resin tapes 130 described above, grooves may be formed in the surface of the substrate electrode 6 itself. The above means for preventing expansion of foams can be applied to portions between a tray and a substrate, or portions between the substrate electrode and a tray.

As apparent from the foregoing description, according to the plasma processing method of the first aspect of the present invention, there is provided a plasma processing method which comprises: evacuating an interior of a vacuum chamber and supplying gas into the vacuum chamber, and then generating plasma in the vacuum chamber while controlling the interior of the vacuum chamber to be at a specified pressure; and processing a substrate or a film on a substrate placed on a substrate electrode in the vacuum chamber while performing heat exchange between the substrate and the substrate electrode via an adhesive sheet disposed between the substrate electrode and the substrate. Therefore, temperature controllability of the substrate can be improved.

Also, according to the plasma processing method of the second aspect of the present invention, there is provided a plasma processing method which comprises: evacuating an interior of a vacuum chamber and supplying gas into the vacuum chamber, and then generating plasma in the vacuum chamber while controlling the interior of the vacuum chamber to be at a specified pressure; and processing a substrate or a film on a substrate on a tray placed on a substrate electrode in the vacuum chamber while performing heat exchange between the tray and the substrate electrode via an adhesive sheet disposed between the tray and the substrate. Therefore, temperature controllability of the substrate can be improved.

Also, according to the plasma processing method of the fourth aspect of the present invention, there is provided a plasma processing method which comprises: transporting a substrate into a vacuum chamber; holding the substrate while deforming the substrate into a convex shape toward a substrate electrode in the vacuum chamber; bringing a neighborhood of a central portion of the substrate deformed in the convex shape into contact with an adhesive sheet provided on a surface of the substrate electrode; bringing almost an entire surface of the substrate into contact with the adhesive sheet provided on the surface of the substrate electrode; and processing the substrate or a film on the substrate by evacuating an interior of the vacuum chamber and supplying gas into the vacuum chamber, and then generating plasma in the vacuum chamber while controlling the interior of the vacuum chamber to be at a specified pressure. Therefore, temperature controllability of the substrate can be improved.

Also, according to the plasma processing method of the fifth aspect of the present invention, there is provided a plasma processing method which comprises: transporting a substrate into a vacuum chamber; holding the substrate above a convex substrate electrode in the vacuum chamber; bringing a neighborhood of a central portion of the substrate into contact with an adhesive sheet provided on a surface of the substrate electrode; bringing almost an entire surface of the substrate into contact with the adhesive sheet provided on the surface of the substrate electrode by pressing an outer edge portion of the substrate against the substrate electrode; and processing the substrate or a film on the substrate by evacuating an interior of the vacuum chamber and supplying gas into the vacuum chamber, and then generating plasma in the vacuum chamber while controlling the interior of the vacuum chamber to be at a specified pressure. Therefore, temperature controllability of the substrate can be improved.

Also, according to the plasma processing method of the sixth aspect of the present invention, there is provided a plasma processing method which comprises: bringing almost an entire surface of a substrate into contact with an adhesive sheet provided on a surface of a tray; transporting the tray into a vacuum chamber; holding the tray above a substrate electrode in the vacuum chamber; placing the tray on the substrate electrode; and processing the substrate or a film on the substrate by evacuating an interior of the vacuum chamber and supplying gas into the vacuum chamber, and then generating plasma in the vacuum chamber while controlling the interior of the vacuum chamber to be at a specified pressure. Therefore, temperature controllability of the substrate can be improved.

Also, according to the plasma processing apparatus of the sixteenth aspect of the present invention, there is provided a plasma processing apparatus which comprises: a vacuum chamber; a gas supply unit for supplying gas into the vacuum chamber; an exhausting unit for exhausting an interior of the vacuum chamber; a pressure-regulating valve for controlling the interior of the vacuum chamber to be at a specified pressure; a substrate electrode for placing thereon a substrate in the vacuum chamber; a high-frequency power supply capable of supplying a high-frequency power to the substrate electrode or a plasma source; and an adhesive sheet, which is disposed on a surface of the substrate electrode and on which the substrate is placed. Therefore, temperature controllability of the substrate can be improved.

Also, according to the plasma processing apparatus of the seventeenth aspect of the present invention, there is provided a plasma processing apparatus which comprises: a substrate mounting station for placing a substrate on a tray having a surface provided with an adhesive sheet; a vacuum chamber; a gas supply unit for supplying gas into the vacuum chamber; an exhausting unit for exhausting an interior of the vacuum chamber; a pressure-regulating valve for controlling the interior of the vacuum chamber to be at a specified pressure; a substrate electrode for placing thereon the tray in the vacuum chamber; and a high-frequency power supply capable of supplying a high-frequency power to the substrate electrode or a plasma source. Therefore, temperature controllability of the substrate can be improved.

Also, according to the tray for plasma processing of the twenty-second aspect of the present invention, there is provided a tray for plasma processing which comprises: an adhesive sheet disposed on a surface on which a substrate is placed. Therefore, temperature controllability of the substrate can be improved.

In addition, combining any arbitrary embodiments together appropriately from among the foregoing various embodiments allows their respective effects to be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method comprising:
   using pins to support a substrate at a peripheral portion of said substrate such that said substrate is convexly deformed so as to have a convexity;
   arranging said substrate relative to a substrate electrode within a vacuum chamber such that said convexity faces an adhesive sheet on a surface of said substrate electrode;
   lowering said pins and thereby bringing a central portion of said convexity into contact with said adhesive sheet;
   further lowering said pins and thereby bringing almost an entire substrate surface into contact with said adhesive sheet; and
   processing said substrate, or a film on said substrate, by
   (i) evacuating said vacuum chamber and supplying gas into said vacuum chamber, and then
   (ii) generating plasma in said vacuum chamber while controlling a pressure within said vacuum chamber to be at a specified value.

2. The plasma processing method according to claim 1, wherein
   convexly deforming a substrate comprises convexly deforming said substrate while supporting said substrate after said substrate has been transported into said vacuum chamber, and
   arranging said substrate relative to a substrate electrode such that said convexity faces an adhesive sheet comprises convexly deforming said substrate while said substrate faces said adhesive sheet.

3. The plasma processing method according to claim 2, wherein
   bringing almost an entire substrate surface into contact with said adhesive sheet comprises removing said convexity and bringing into contact with said adhesive sheet the surface of said substrate that defined said convexity.

4. The plasma processing method according to claim 1, wherein
   bringing almost an entire substrate surface into contact with said adhesive sheet comprises removing said convexity and bringing into contact with said adhesive sheet the surface of said substrate that defined said convexity.

5. A plasma processing method comprising:
   within a vacuum chamber, using pins to support a substrate, at a peripheral portion of said substrate, adjacent an adhesive sheet provided on a convex substrate electrode such that said adhesive sheet has a convexity;
   lowering said pins and thereby bringing a central portion of a substrate surface into contact with said convexity of said adhesive sheet; then
   bringing into contact with said convexity of said adhesive sheet almost a remainder of said substrate surface by one of
   (i) further lowering said pins; and
   (ii) bringing a clamp member into contact with said substrate; and
   processing said substrate, or a film on said substrate, by
   (i) evacuating said vacuum chamber and supplying gas into said vacuum chamber, and then
   (ii) generating plasma in said vacuum chamber while controlling a pressure within said vacuum chamber to be at a specified value.

6. The plasma processing method according to claim 5, wherein
   supporting a substrate adjacent an adhesive sheet comprises supporting said substrate above said adhesive sheet after said substrate has been transported into said vacuum chamber.

7. The plasma processing method according to claim 6, wherein
   bringing almost a remainder of said substrate surface into contact with said convexity of said adhesive sheet comprises pressing an outer edge portion of said substrate.

8. The plasma processing method according to claim 6, further comprising:
   convexly deforming said substrate such that said substrate has a convexity, whereby
   (i) bringing a central portion of said substrate surface into contact with said convexity of said adhesive sheet comprises bringing a central portion of said convexity of said substrate into contact with said convexity of said adhesive sheet, and
   (ii) bringing almost a remainder of said substrate surface into contact with said convexity of said adhesive sheet comprises bringing almost said remainder of said substrate surface into contact with said convexity of said adhesive sheet after removing said convexity of said substrate and bringing into contact with said convexity of said adhesive sheet the surface of said substrate that defined said convexity of said substrate.

9. The plasma processing method according to claim 5, wherein
   bringing almost a remainder of said substrate surface into contact with said convexity of said adhesive sheet comprises pressing an outer edge portion of said substrate.

10. The plasma processing method according to claim 5, further comprising:
    convexly deforming said substrate such that said substrate has a convexity, such that
    (i) bringing a central portion of said substrate surface into contact with said convexity of said adhesive sheet comprises bringing a central portion of said convexity of said substrate into contact with said convexity of said adhesive sheet, and
    (ii) bringing almost a remainder of said substrate surface into contact with said convexity of said adhesive sheet comprises bringing almost said remainder of said substrate surface into contact with said convexity of said adhesive sheet after removing said convexity of said substrate and bringing into contact with said convexity of said adhesive sheet the surface of said substrate that defined said convexity of said substrate.

11. A plasma processing method comprising:
using pins to support a substrate at a peripheral portion of said substrate such that said substrate is convexly deformed so as to have a convexity;
arranging said substrate relative to a tray within a vacuum chamber such that said convexity faces an adhesive sheet on a surface of said tray;
lowering said pins and thereby bringing a central portion of said convexity into contact with said adhesive sheet;
further lowering said pins and thereby bringing almost an entire substrate surface into contact with said adhesive sheet; and
processing said substrate, or a film on said substrate, by
  (i) evacuating said vacuum chamber and supplying gas into said vacuum chamber, and then
  (ii) generating plasma in said vacuum chamber while controlling a pressure within said vacuum chamber to be at a specified value.

12. The plasma processing method according to claim 11, wherein
convexly deforming a substrate comprises convexly deforming said substrate while supporting said substrate after said substrate has been transported into said vacuum chamber, and
arranging said substrate relative to a tray such that said convexity faces an adhesive sheet comprises convexly deforming said substrate while said substrate faces said adhesive sheet.

13. The plasma processing method according to claim 12, wherein
bringing almost an entire substrate surface into contact with said adhesive sheet comprises removing said convexity and bringing into contact with said adhesive sheet the surface of said substrate that defined said convexity.

14. The plasma processing method according to claim 11, wherein
bringing almost an entire substrate surface into contact with said adhesive sheet comprises removing said convexity and bringing into contact with said adhesive sheet the surface of said substrate that defined said convexity.

15. A plasma processing method comprising:
within a vacuum chamber, using pins to support a substrate, at a peripheral portion of said substrate, adjacent an adhesive sheet provided on a convex tray such that said adhesive sheet has a convexity;
lowering said pins and thereby bringing a central portion of a substrate surface into contact with said convexity of said adhesive sheet; then
bringing into contact with said convexity of said adhesive sheet almost a remainder of said substrate surface by one of
  (i) further lowering said pins, and
  (ii) bringing a clam member into contact with said substrate; and
processing said substrate, or a film on said substrate, by
  (i) evacuating said vacuum chamber and supplying gas into said vacuum chamber, and then
  (ii) generating plasma in said vacuum chamber while controlling a pressure within said vacuum chamber to be at a specified value.

16. The plasma processing method according to claim 15, wherein
supporting a substrate adjacent an adhesive sheet comprises supporting said substrate above said adhesive sheet after said substrate has been transported into said vacuum chamber.

17. The plasma processing method according to claim 16, wherein
bringing almost a remainder of said substrate surface into contact with said convexity of said adhesive sheet comprises pressing an outer edge portion of said substrate.

18. The plasma processing method according to claim 16, further comprising:
convexly deforming said substrate such that said substrate has a convexity, such that
  (i) bringing a central portion of said substrate surface into contact with said convexity of said adhesive sheet comprises bringing said central portion of said convexity of said substrate into contact with said convexity of said adhesive sheet, and
  (ii) bringing almost a remainder of said substrate surface into contact with said convexity of said adhesive sheet comprises bringing almost said remainder of said substrate surface into contact with said convexity of said adhesive sheet after removing said convexity of said substrate and bringing into contact with said convexity of said adhesive sheet the surface of said substrate that defined said convexity of said substrate.

19. The plasma processing method according to claim 15, wherein
bringing almost a remainder of said substrate surface into contact with said convexity of said adhesive sheet comprises pressing an outer edge portion of said substrate.

20. The plasma processing method according to claim 15, further comprising:
convexly deforming said substrate such that said substrate has a convexity, such that
  (i) bringing a central portion of said substrate surface into contact with said convexity of said adhesive sheet comprises bringing said central portion of said convexity of said substrate into contact with said convexity of said adhesive sheet, and
  (ii) bringing almost a remainder of said substrate surface into contact with said convexity of said adhesive sheet comprises bringing almost said remainder of said substrate surface into contact with said convexity of said adhesive sheet after removing said convexity of said substrate and bringing into contact with said convexity of said adhesive sheet the surface of said substrate that defined said convexity of said substrate.

21. A plasma processing method comprising:
using pins to support a substrate adjacent a tray within a vacuum chamber so as to downwardly project said substrate with respect to said tray;
lowering said pins and thereby bringing almost an entire surface of said substrate into contact with an adhesive sheet on a surface of said tray, while exhausting gas from between said substrate and said tray; and processing said substrate, or a film on said substrate, by
(i) evacuating said vacuum chamber and supplying gas into said vacuum chamber, and then
(ii) generating plasma in said vacuum chamber while controlling a pressure within said vacuum chamber to be at a specified value.

22. The plasma processing method according to claim 21, wherein
holding a substrate adjacent a tray within a vacuum chamber comprises holding said substrate above said tray after said substrate has been transported into said vacuum chamber.

23. The plasma processing method according to claim 21, wherein
said adhesive sheet has a thermal conductivity of at least 0.1 W/m K, a hardness of from 50 to 60, Asker C of at most 80, and a thickness of from 0.05 mm to 0.5 mm.

24. The plasma processing method according to claim 21, wherein material of said adhesive sheet has a self-adhesion property.

25. The plasma processing method according to claim 24, wherein said material of said adhesive sheet comprises a silicon robber.

* * * * *

UNITED STATES PATENT AND TRADEMARK OFFICE
CERTIFICATE OF CORRECTION

PATENT NO. : 7,232,591 B2
APPLICATION NO. : 10/408261
DATED : June 19, 2007
INVENTOR(S) : Tomohiro Okumura et al.

It is certified that error appears in the above-identified patent and that said Letters Patent is hereby corrected as shown below:

In column 24, line 4, "pins; and" should be --pins, and--.

In column 25, line 55, "clam member" should be --clamp member--.

In column 28, line 11, "silicon robber" should be --silicon rubber--.

Signed and Sealed this

Twenty-fifth Day of December, 2007

JON W. DUDAS
*Director of the United States Patent and Trademark Office*